(12) United States Patent
Laven et al.

(10) Patent No.: US 9,641,168 B2
(45) Date of Patent: May 2, 2017

(54) CONTROLLING REVERSE CONDUCTING IGBT

(71) Applicant: Infineon Technologies AG, Neubiberg (DE)

(72) Inventors: Johannes Georg Laven, Taufkirchen (DE); Heiko Rettinger, Munich (DE); Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/725,269

(22) Filed: May 29, 2015

(65) Prior Publication Data

US 2016/0352326 A1    Dec. 1, 2016

(51) Int. Cl.
    *H03B 1/00*      (2006.01)
    *H03K 17/567*    (2006.01)

(52) U.S. Cl.
    CPC .................................. *H03K 17/567* (2013.01)

(58) Field of Classification Search
    CPC .................................................... H03K 17/567
    See application file for complete search history.

(56) References Cited

U.S. PATENT DOCUMENTS

| | | | | |
|---|---|---|---|---|
| 2013/0321062 A1* | 12/2013 | Eckel | ................... | H02M 1/0845 327/382 |
| 2015/0015309 A1 | 1/2015 | Werber | | |
| 2015/0144988 A1 | 5/2015 | Laven et al. | | |
| 2015/0365083 A1 | 12/2015 | Jaeger et al. | | |

FOREIGN PATENT DOCUMENTS

DE     102014108451 B3     8/2015

OTHER PUBLICATIONS

Laven, et al., "Semiconductor Device with Semiconductor Mesa Including a Constriction", U.S. Appl. No. 14/248,371, filed Apr. 9, 2014.
Schreiber, Dejan, "New Power Semiconductor Technology for Renewable Energy Sources Application", Semikron, Sevilla, May 12, 2005.
Sumitomo, et al., "Low loss IGBT with Partially Narrow Mesa Structure (PNM-IGBT)", Proceedings of the 2012 24th International Symposium on Power Semiconductor Devices and ICs, Bruges, Belgium, Jun. 3-7, 2012, Jun. 2012, pp. 17-20.
Werber, et al., "6.5kV RCDC for Increased Power Density in IGBT-Modules", ISPSD Jun. 2014, Waikoloa, Hawaii, 2014, pp. 35-38.

* cited by examiner

*Primary Examiner* — Daniel Puentes
(74) *Attorney, Agent, or Firm* — Murphy, Bilak & Homiller, PLLC

(57) ABSTRACT

A method for controlling a first switch and a second switch is suggested, wherein each switch is an RC-IGBT and wherein both switches are arranged as a half-bridge circuit. The method includes: controlling the first switch in an IGBT-mode; controlling the second switch such that it becomes desaturated when being in a DIODE-mode; wherein controlling the second switch starts before and lasts at least as long as the first switch changes its IGBT-mode from blocking state to conducting state.

21 Claims, 23 Drawing Sheets

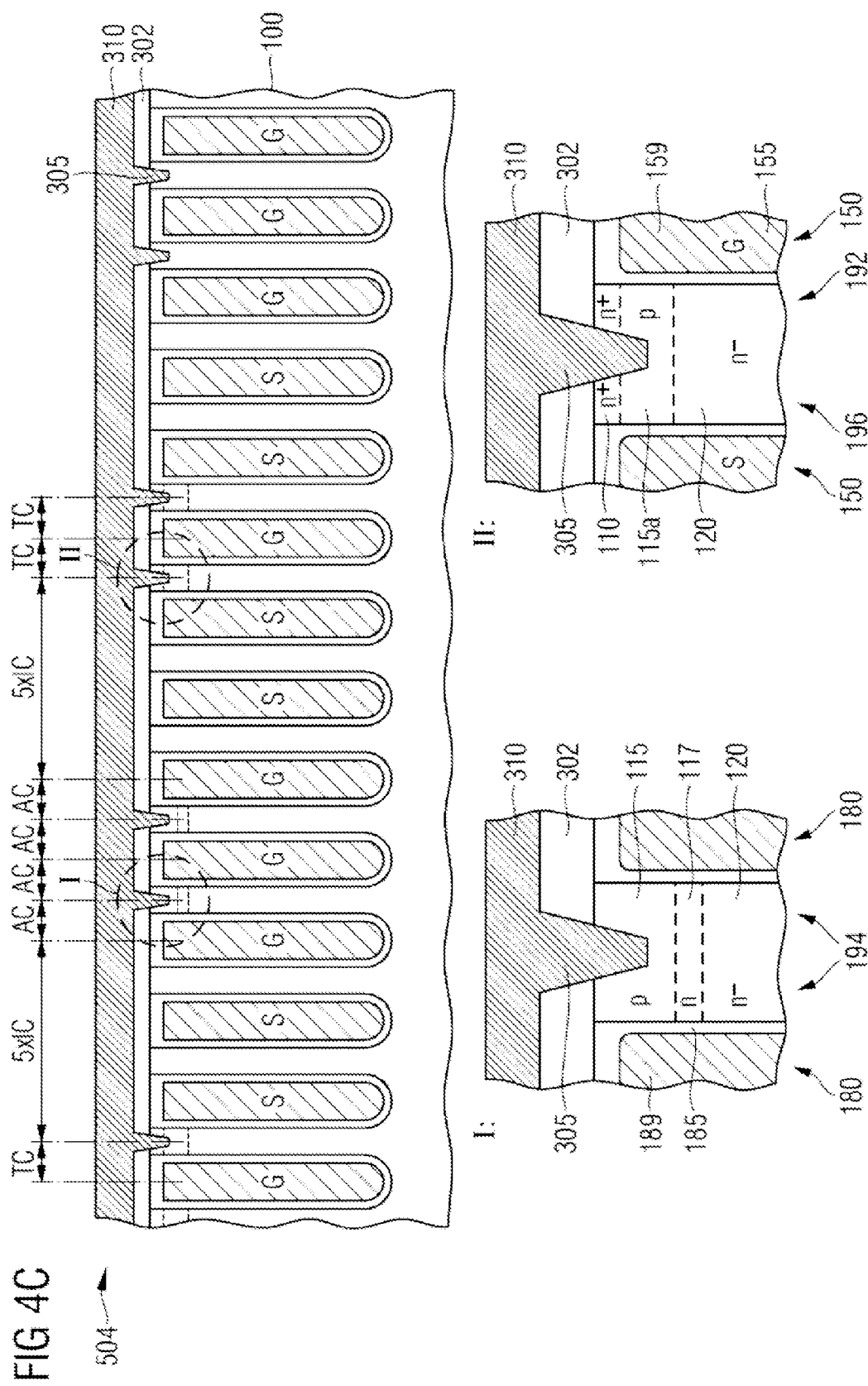

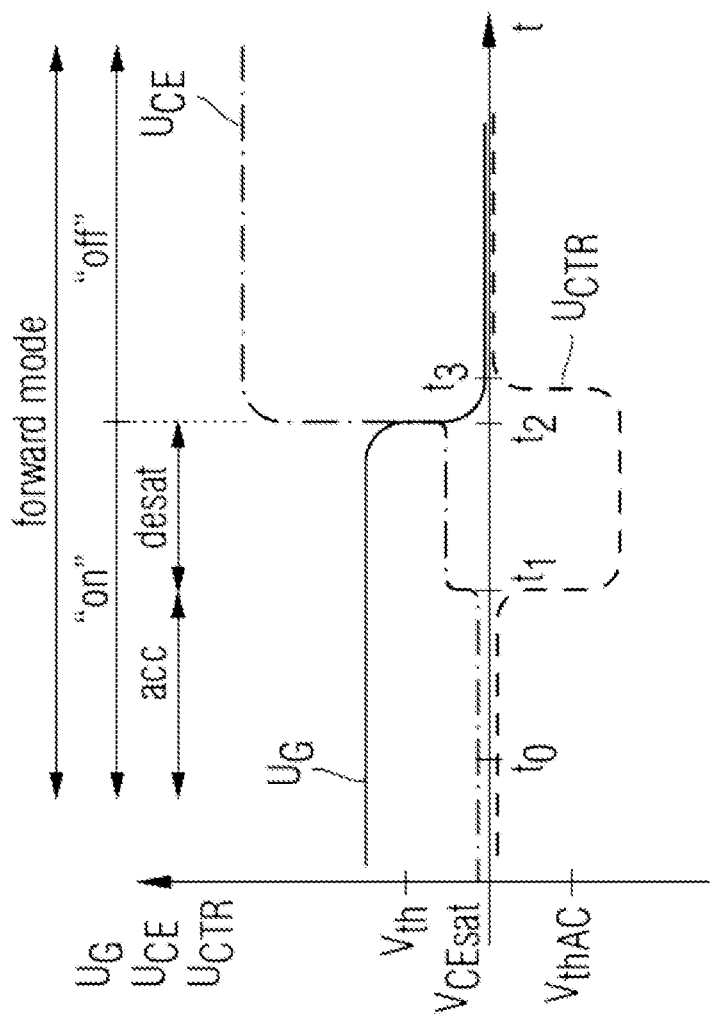

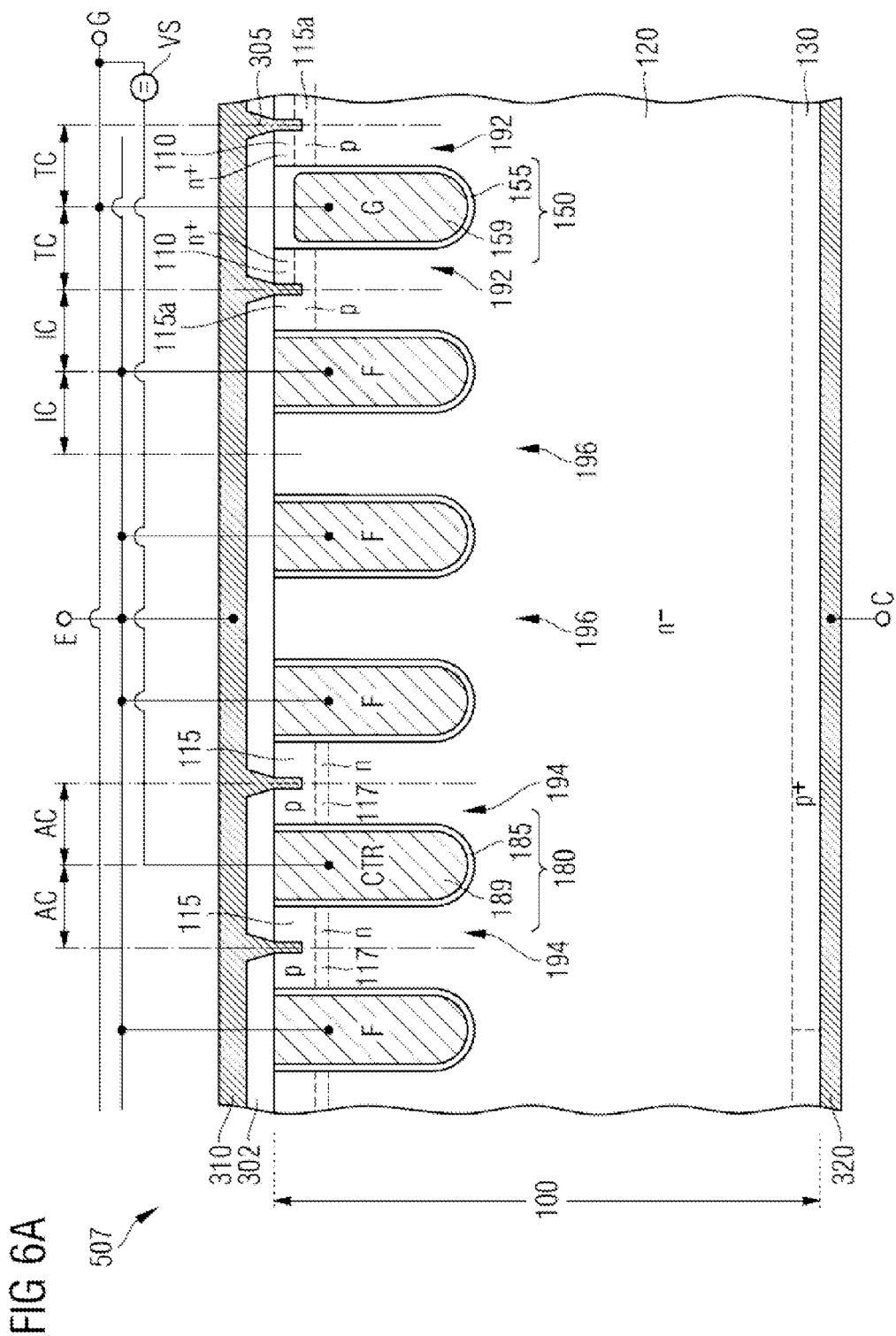

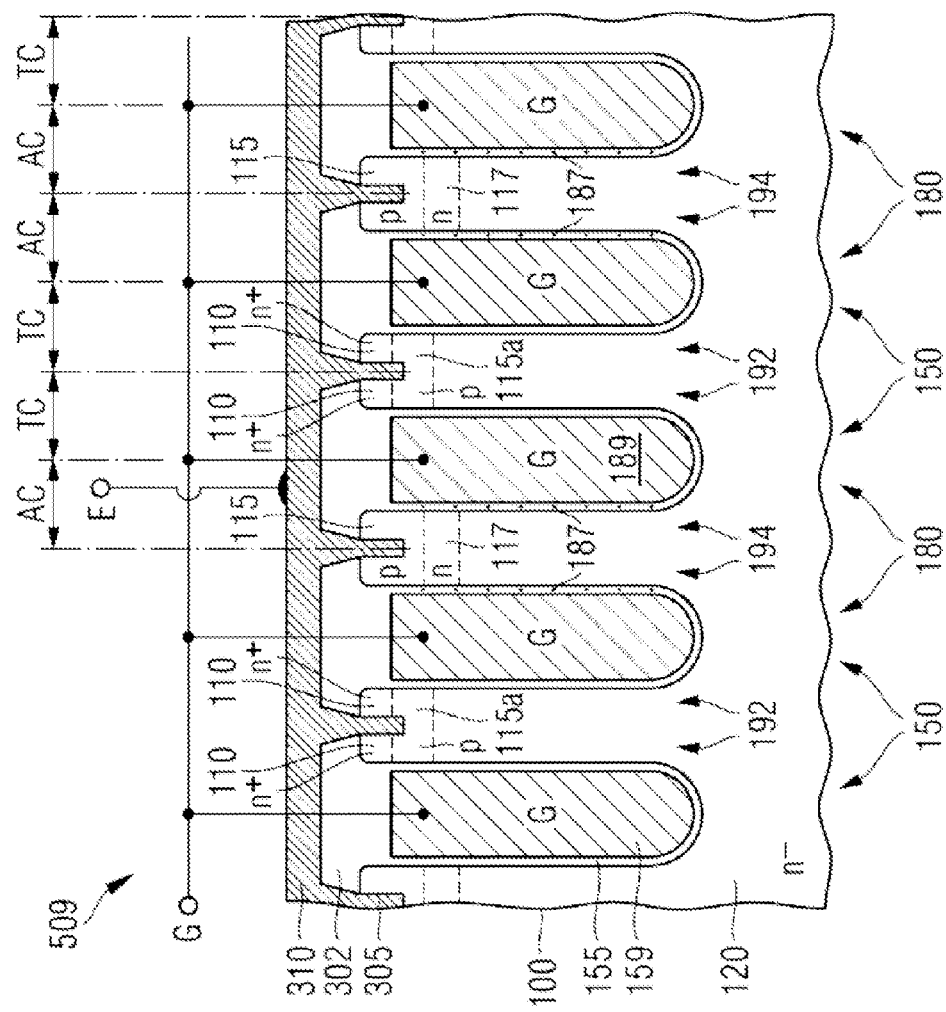

| $V_g$ \ $V_{ce}$ | >0 "IGBT-mode" | <0 "Diode-mode" |
|---|---|---|
| +15V | Conducting state<br>• Conducting | desaturation state (strong)<br>• Conducting<br>• Very weak bipolar injection<br>• MOS-desaturation |
| 0V | Blocking state<br>• Blocking | RC desaturation state<br>• Conducting<br>• Weak bipolar injection<br>• Desaturation |
| -15V | | RC enhancement state<br>• Conducting<br>• Strong bipolar injection |

Fig.10

US 9,641,168 B2

CONTROLLING REVERSE CONDUCTING IGBT

BACKGROUND

Embodiments of the present invention relate to a method for controlling at least one reverse conducting (RC) IGBT, in particular a half-bridge circuit comprising two RC-IGBTs.

SUMMARY

A first embodiment relates to a method for controlling a first switch and a second switch, wherein each switch is an RC-IGBT and wherein both switches are arranged as a half-bridge circuit, the method comprising:
controlling the first switch in an IGBT-mode;
controlling the second switch such that it becomes desaturated when being in a DIODE-mode;
wherein controlling the second switch starts before and lasts at least as long as the first switch changes its IGBT-mode from blocking state to conducting state.

A second embodiment relates to a device for operating a first switch and a second switch, wherein each switch is an RC-IGBT and wherein both switches are arranged as a half-bridge circuit, said device comprising a processing unit which is arranged to
controlling the first switch in an IGBT-mode;
controlling the second switch such that it becomes desaturated when being in a DIODE-mode;
wherein controlling the second switch starts before and lasts at least as long as the first switch changes its IGBT-mode from blocking state to conducting state.

A third embodiment relates to a device for controlling a first switch and a second switch, wherein each switch is an RC-IGBT and wherein both switches are arranged as a half-bridge circuit:
means for controlling the first switch in an IGBT-mode;
means for controlling the second switch such that it becomes desaturated when being in a DIODE-mode;
wherein controlling the second switch starts before and lasts at least as long as the first switch changes its IGBT-mode from blocking state to conducting state.

A fourth embodiment is directed to a computer program product directly loadable into a memory of a digital processing device, comprising software code portions for performing the steps of the method described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

FIG. 4C is a schematic cross-sectional view of a portion of an RC-IGBT in accordance with an embodiment providing controllable injection cells as well as idle cells.

FIG. 5B is a schematic timing diagram illustrating a method of operating the non RC-IGBT of FIG. 5A.

FIG. 6A is a schematic cross-sectional view of a portion of a non RC-IGBT according to another embodiment providing collective control of desaturation and transistor cells using a voltage shifter.

FIG. 6D is a schematic cross-sectional view of a portion of a non RC-IGBT with collectively controlled desaturation and transistor cells using control dielectrics containing fixed negative charges in accordance with a further embodiment related to alternatingly arranged desaturation and transistor cells.

FIG. 10 shows a table comprising modes and states for an RC-IGBT;

DETAILED DESCRIPTION

Figure 1:
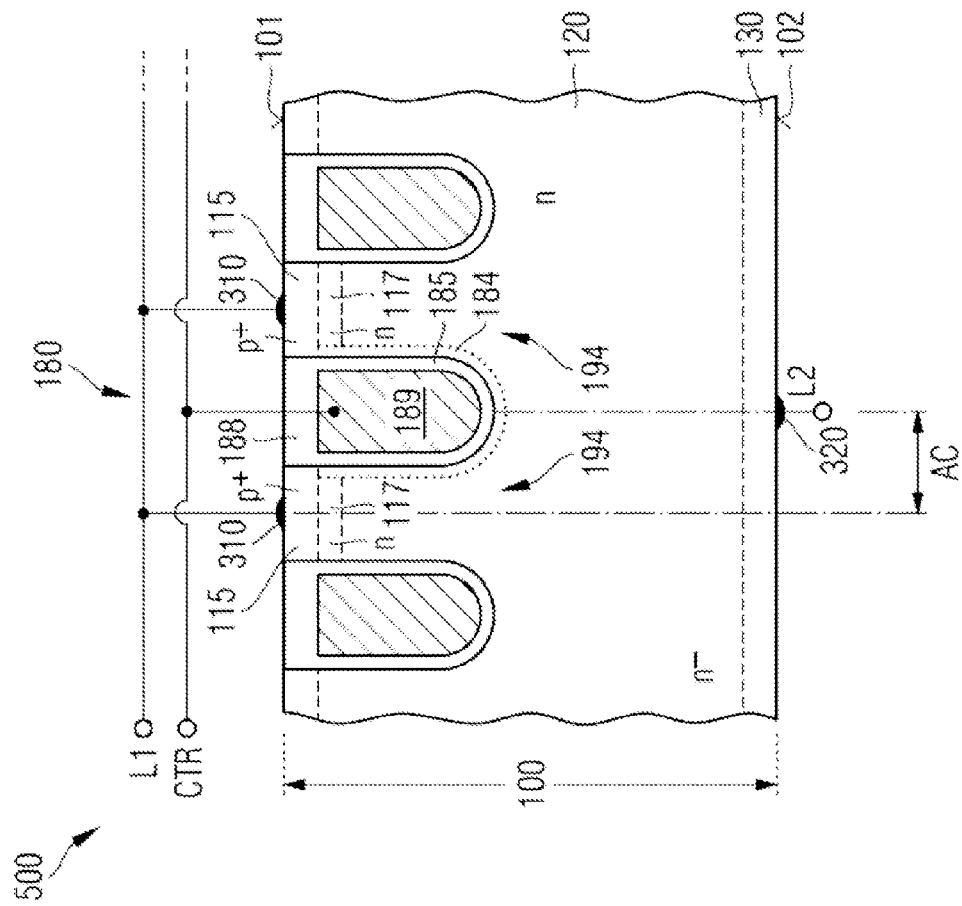
FIG. 1 is a schematic cross-sectional view of a portion of a semiconductor device in accordance with embodiments related to controllable auxiliary cells.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Reverse conducting (RC) IGBTs are described in, e.g., [D. Werber, F. Pfirsch, T. Gutt, V. Komarnitskyy, C. Schaeffer, T. Hunger, D. Domes: "6.5 kV RCDC For Increased Power Density in IGBT-Modules", ISPSD 2014, Waikoloa, Hi., 2014].

Reverse conducting IGBTs can be built if a p-doped collector region is partially interrupted by means of n-doped regions. Doing so, on the one hand, the diode functionality is given, on the other hand, there is enough area for the IGBT to inject minority carriers into the drift region for a low forward voltage $V_{ce(sat)}$. With such an approach, a diode functionality is no longer independent from the state of the gate control.

RC-IGBTs, Technology, Structure, Embodiments

FIG. 1 shows a portion of a semiconductor device 500 that may be a semiconductor diode or an IGBT, for example an RB-IGBT (reverse blocking IGBT) or an RC-IGBT (reverse conducting IGBT). A semiconductor body 100 of the semiconductor device 500 is provided from a single crystalline semiconductor material, for example silicon (Si), silicon carbide (SiC), germanium (Ge), a silicon germanium crystal (SiGe), gallium nitride (GaN) or gallium arsenide (GaAs) by way of example.

The semiconductor body 100 has a first surface 101, which may be approximately planar or which may be given by a plane spanned by coplanar surface sections, as well as a mainly planar second surface 102 parallel to the first surface 101. A minimum distance between the first and second surfaces 101, 102 is selected to achieve a specified voltage blocking capability of the semiconductor device 500. For example, the distance between the first and second surfaces 101, 102 may be 90 µm to 110 µm for an IGBT specified for a blocking voltage of about 1200V. Other embodiments related to PT-IGBTs (punch through IGBTs) or IGBTs with high blocking capabilities may provide semiconductor bodies 100 with a thickness of several 100 µm.

In a plane perpendicular to the cross-sectional plane the semiconductor body 100 may have a rectangular shape with an edge length in the range of several millimeters. A normal to the first surface 101 defines a vertical direction and directions orthogonal to the vertical direction are lateral directions.

The semiconductor body 100 includes a drift region 120 of a first conductivity type, a charge carrier transfer region 115 of a second conductivity type, which is opposite to the first conductivity type, between the first surface 101 and the drift region 120 as well as a pedestal layer 130 between the drift region 120 and the second surface 102.

For the illustrated embodiments the first conductivity type is n-type and the second conductivity type is p-type. Similar considerations as outlined below apply to embodiments with the first conductivity type being p-type and the second conductivity type being n-type.

An impurity concentration in the drift region 120 may gradually or in steps increase or decrease with increasing distance to the first surface 101 at least in portions of its vertical extension. According to other embodiments the impurity concentration in the drift region 120 may be approximately uniform. A mean impurity concentration in the drift region 120 may be between $1 \times 10^{12}$ (1E12) cm$^{-3}$ and $1 \times 10^{15}$ (1E15) cm$^{-3}$, for example in a range from $5 \times 10^{12}$ (5E12) cm$^{-3}$ to $5 \times 10^{13}$ (5E13) cm$^{-3}$.

The pedestal layer 130 may have the first conductivity type in case the semiconductor device 500 is a semiconductor diode, the second conductivity type in case the semiconductor device 500 is a non RC-IGBT, or may include zones of both conductivity types extending between the drift region 120 and the second surface 102 in case the semiconductor device 500 is an RC-IGBT. A mean impurity concentration for a p-type pedestal layer 130 or p-type zones of the pedestal layer 130 may be at least $1 \times 10^{16}$ (1E16) cm$^{-3}$, for example at least $5 \times 10^{17}$ (5E17) cm$^3$.

The charge carrier transfer region 115 may directly adjoin the first surface 101. According to the illustrated embodiment, the charge carrier transfer region 115 may be formed on top of an auxiliary mesa section 194, wherein each auxiliary mesa section 194 directly adjoins a control structure 180.

A barrier region 117 sandwiched between the charge carrier transfer region 115 and the drift region 120 forms a pn junction with the charge carrier transfer region 115 and a homojunction with the drift region 120. The barrier region 117 has the first conductivity type. A mean impurity concentration in the barrier region 117 is at least ten times as high as a mean impurity concentration in the drift region 120. According to an embodiment, the mean impurity concentration in the barrier region 117 may range from $1\times10^{16}$ (1E16) cm$^{-3}$ to $1\times10^{18}$ (1E18) cm$^{-3}$, for example from $1\times10^{17}$ (1E17) to $5\times10^{17}$ (5E17) cm$^3$. The impurities may be phosphorus (P), arsenic (As), selenium (Se) and/or sulfur (S) atoms/ions.

When the pn junction between the charge carrier transfer region 115 and the barrier region 117 is forward biased the charge carrier transfer region 115 injects majority-type charge carriers through the barrier region 117 into the drift region 120. In case of a semiconductor diode, the charge carrier transfer region 115 is effective as an anode region connected to an anode electrode. For RC-IGBTs the charge carrier transfer region 115 is effective as the anode region of the reverse diode. In case of non RC-IGBTs the charge carrier transfer region 115 supports extraction of charge carriers from the drift region 120 in a desaturation period.

The control structure 180 may extend from the first surface 101 into the semiconductor body 100 at least down to the drift region 120. According to the illustrated embodiment the control structure 180 extends into the drift region 120. The control structure 180 may include a conductive control electrode 189 and a control dielectric 185 separating the control electrode 189 from the semiconductor body 100. The control dielectric 185 is formed between the barrier region 117 and the drift region 120 on the one side and the control electrode 189 on the other side.

The control dielectric 185 may have a uniform thickness. According to other embodiments, a bottom portion of the control dielectric 185 oriented to the second surface 102 may be thicker than a top portion oriented to the first surface 101. According to further embodiments the control structure 180 may include a field electrode of a conductive material. The field electrode is dielectrically insulated from the gate electrode 189 and arranged between the gate electrode 189 and the second surface 102. A field electrode or a thick control dielectric along the drift region 120 may reduce a capacitive coupling between the drift region 120 and the control electrode 189 and stabilizes the potential applied to the control electrode 189.

The control electrode 189 may be a homogenous structure or may have a layered structure including one or more metal containing layers. According to an embodiment the control electrode 189 may include or consist of a heavily doped polycrystalline silicon layer.

The control dielectric 185 may include or consist of a semiconductor oxide, for example thermally grown or deposited silicon oxide, a semiconductor nitride, for example deposited or thermally grown silicon nitride, or a semiconductor oxynitride, for example silicon oxynitride.

The semiconductor device 500 may be arranged not to form, in the charge carrier transfer region 115, an inversion layer through which minority charge carriers flow between the drift region 120 and a load electrode when a positive voltage is applied to the control electrode 189.

According to an embodiment, a top dielectric 188 may extend between the first surface 101 and the control electrode 189 such that the control electrode 189 does not sufficiently overlap with the charge carrier transfer region 115 along the vertical direction to form a continuous inversion channel through the charge carrier transfer region 115.

According to another embodiment, the charge carrier transfer region 115 may directly adjoin the control structure 180 at the first surface 101 such that the auxiliary mesa section 194 is devoid of a region of the first conductivity type between the first surface 101 and the charge carrier transfer region 115 at least along the control structure 180.

According to a further embodiment a dielectric structure may be provided on the first surface 101 on both sides of the vertical projection of the interface between the charge carrier transfer region 115 and the control structure 180.

In the illustrated embodiment both the lacking overlap between the control electrode 185 and the charge carrier transfer region 115 and the lack of a region of the first conductivity type along the first surface 101 at the outer edge of the control structure 180 inhibit an electron path through the charge carrier transfer region 115.

A distance between the first surface 101 and a bottom of the control structures 180 may range from 1 µm to 30 µm, e.g. from 3 µm to 7 µm. A lateral width of the auxiliary mesa sections 194 may range from 0.05 µm to 10 µm, e.g. from 0.15 µm to 1 µm. A distance between the first surface 101 and the pn junction between barrier region 117 and charge carrier transfer region 115 may range from 0.5 µm to 5 µm, e.g. from 1 µm to 1.5 µm.

The barrier region 117 may or may not include a lower doped portion having an impurity concentration of the drift region 120 on the side oriented to the charge carrier transfer region 115.

A total impurity quantity (effective anode dose) in the charge carrier transfer region 115 is set such that it prevents a depletion region extending from the pn junction between the charge carrier transfer region 115 and the barrier region 117 from reaching the first surface 101 or a contact structure that extends from the first surface 101 into the semiconductor body 100 at the operation conditions the semiconductor device 500 is specified for. For example, the total impurity quantity in the charge carrier transfer region 115 may be the result of a p-type implant dose of about $5\times10^{12}$ (5E12) cm$^{-2}$ and a following etch of contact grooves that removes portions of the implanted areas.

A first load electrode 310, which may be, e.g., an anode electrode of a semiconductor diode or an emitter electrode of an IGBT, is electrically connected with the charge carrier transfer regions 115. The first load electrode 310 may be or may be electrically coupled or connected to a first load terminal L1, for example the anode terminal of a semiconductor diode or the emitter terminal of an IGBT. The control electrode 189 may be electrically connected or coupled to a control terminal CTR or electrically connected or coupled to a gate terminal of the semiconductor device 500.

A second load electrode 320 directly adjoins the second surface 102 and the pedestal layer 130. The second load electrode 320 may be or may be electrically connected to a second load terminal L2, which may be the cathode terminal of a semiconductor diode or the collector terminal of an IGBT.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

A half of a control structure 180 and an adjoining auxiliary mesa section 194 including the charge carrier transfer and barrier regions 115, 117 form an auxiliary cell AC. A plurality of auxiliary cells AC may be arranged along a lateral direction with the auxiliary cells AC having the same orientation. According to other embodiments, the auxiliary cells AC are arranged in pairs, wherein the auxiliary cells AC of each pair are arranged mirror-inverted to each other along a vertical axis which may be an axis through the control structure 180 or through the auxiliary mesa sections 194. The semiconductor body 100 may or may not include other cell types, for example transistor cells or idle cells.

For semiconductor diodes and RC-IGBTs the auxiliary cells AC are controlled to form an inversion layer 184 in the drift and barrier regions 120, 117 in an inversion state and to form no inversion layer in the drift and barrier regions 120, 117 in a non-inversion state. The inversion layer 184 increases the effective anode emitter area and hence the anode emitter efficiency in a forward conducting mode of a semiconductor diode or the reverse conducting mode (diode mode) of an RC-IGBT including an integrated free-wheeling diode.

By switching on and off the inversion layer 184 the control structure 180 allows the semiconductor device 500 to change in-situ between a low-frequency mode with comparatively low static losses and high dynamic switching losses and a high-frequency mode with high static losses and low dynamic switching losses.

Alternatively or in addition, the non-inversion state can be used to de-saturate a semiconductor device before reverse biasing a forward-biased pn junction of a semiconductor diode or the forward-biased pn junction of a freewheeling diode of an RC-IGBT.

The effective anode efficiency in the non-inversion state is given by the effective anode dose in the charge carrier transfer region 115. The effective anode efficiency in the inversion state is given by the sum of the effective anode dose of the charge carrier transfer region 115 and the anode efficiency of the p-type inversion layer accumulating holes. As a consequence, a lower effective anode dose allows a wider spread of the anode emitter efficiency between the inversion state and the non-inversion state. A wide spread or difference between the anode emitter efficiency in the inversion state and the anode emitter efficiency in the non-inversion state allows a better tradeoff between dynamic and static switching losses and/or provides a more effective desaturation cycle.

The barrier region 117 virtually reduces the effective anode dose and hence the anode emitter efficiency without reducing the actual impurity dose within the charge carrier transfer region 115. In contrast to other methods for reducing the effective anode dose, for example by over-etching a contact hole into the charge carrier transfer region 115 after implantation or by a significantly reduced peak impurity concentration in the charge carrier transfer region 115, which both are difficult to control, the formation of the barrier region 117 is comparatively simple and less delicate. In addition, the barrier region 117 may increase the ruggedness against critical current filamentation events in the semiconductor body 100.

According to embodiments related to non RC-IGBTs, the auxiliary cells AC may be operated as desaturation cells actively draining off charge carriers from the drift region 120 through the first load electrodes 310 prior to a turn-off signal applied to the gate electrode of an RB- or RC-IGBT in forward operation.

The semiconductor device 500 may be arranged not to form an inversion path through the charge carrier transfer region 115. For example, the control electrode 180 is not connected to a network node to which a signal is applied that exceeds a threshold voltage for formation of an n-type inversion layer in the p-type charge carrier transfer region 115. Alternatively, the top dielectric 188 may overlap with the charge carrier transfer region 115 along the vertical direction or the auxiliary mesa section 194 is devoid of a source region between the first surface 101 and the charge carrier transfer region 115.

Figure 2A:
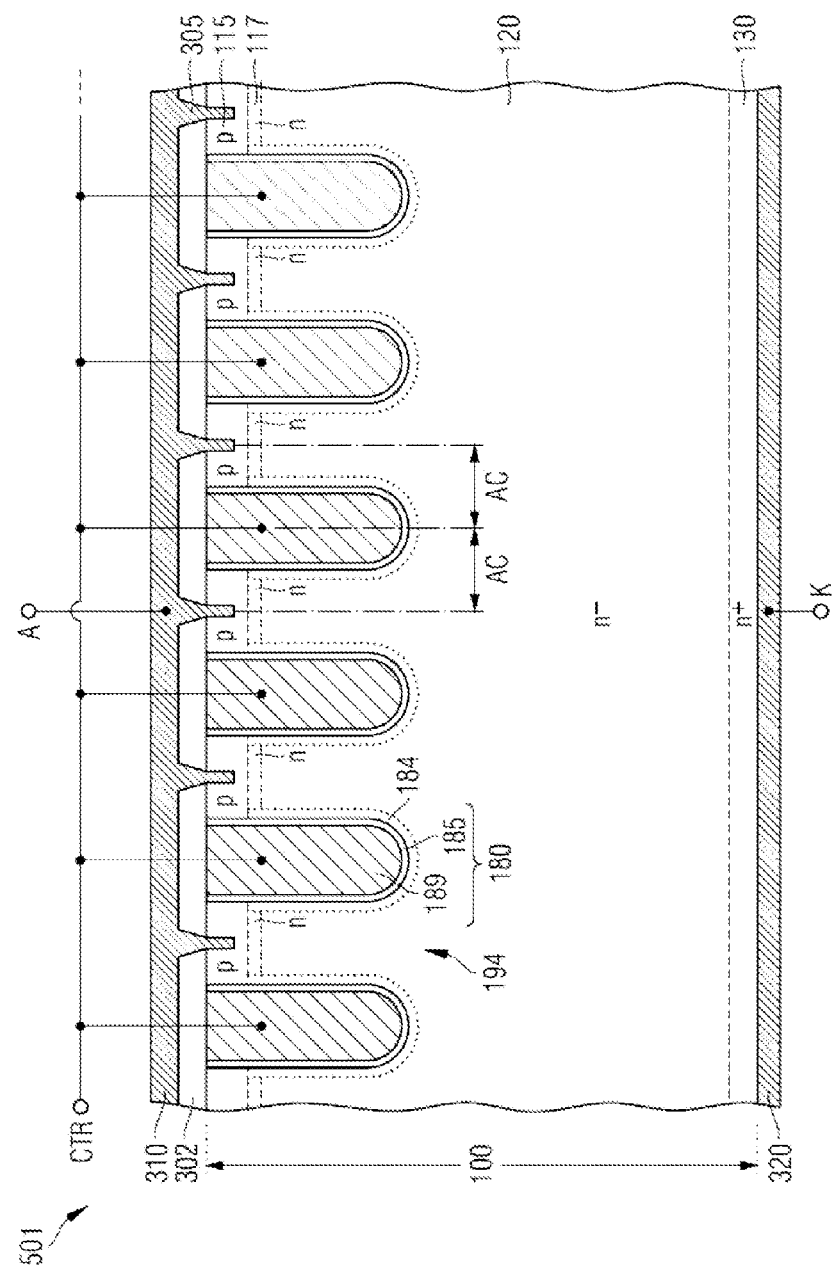
FIG. 2A is a schematic cross-sectional view of a portion of a semiconductor diode with controllable injection cells according to an embodiment.

The semiconductor diode 501 of FIG. 2A refers to embodiments with controllable anode emitter efficiency. The semiconductor diode 501 is based on the semiconductor device 500 of FIG. 1, wherein the first load electrode 310 forms an anode electrode that forms or is electrically connected to an anode terminal A.

Contacts 305 extending through openings of a dielectric structure 302 electrically connect the first load electrode 310 with the charge carrier transfer regions 115. The pedestal layer 130 has the first conductivity type and forms a homojunction with the drift region 120. The second load electrode 320 forms a cathode terminal K or is electrically connected to the cathode terminal K. The auxiliary cells AC may be arranged in pairs with the two auxiliary cells AC of each pair arranged mirror-inverted with respect to a center axis of the control structures 180. The control electrodes 189 are electrically connected to a control terminal CTR or to an output of an integrated control circuit supplying a control signal $U_{CTR}$. For further details, reference is made to the description of FIG. 1.

The control signal $U_{CTR}$ applied to the control electrodes 189 controls the anode emitter efficiency of the auxiliary cells AC, which are effective as injection cells in the forward mode of the semiconductor diode 501. At voltages at the control electrodes 189 below a threshold voltage $V_{thAC}$ of the auxiliary cells AC p-type inversion layers 184 are formed along the control structures 180 in the barrier and drift regions 117, 120, wherein the inversion layers 184 increase the effective anode area and the anode emitter efficiency. Above the negative first threshold voltage $V_{thAC}$, no inversion layer is formed and the effective anode emitter area and the anode emitter efficiency are low. At least up to a second threshold voltage $V_{th}$ at which an n-type inversion layer may be formed in the charge carrier transfer regions 115, the semiconductor diode 501 maintains its full reverse blocking capabilities such that the semiconductor diode 501 can directly switch from a desaturation period within the forward conducting mode to a reverse blocking mode.

The barrier region 117 increases the spread or difference between the anode emitter efficiencies of the inversion state and the non-inversion state in a well-controllable way such that the efficiency of the desaturation period can be increased in a well-defined manner.

According to an embodiment, the barrier region 117 contains at least one deep level donor or deep double donor, e.g., sulfur and/or selenium atoms/ions. With deep level donors, the doping level increases with increasing temperature, wherein a locally increasing doping level locally reduces anode emitter efficiency and thus counteracts an inhomogeneous current distribution among parallel auxiliary cells.

Figure 2B:
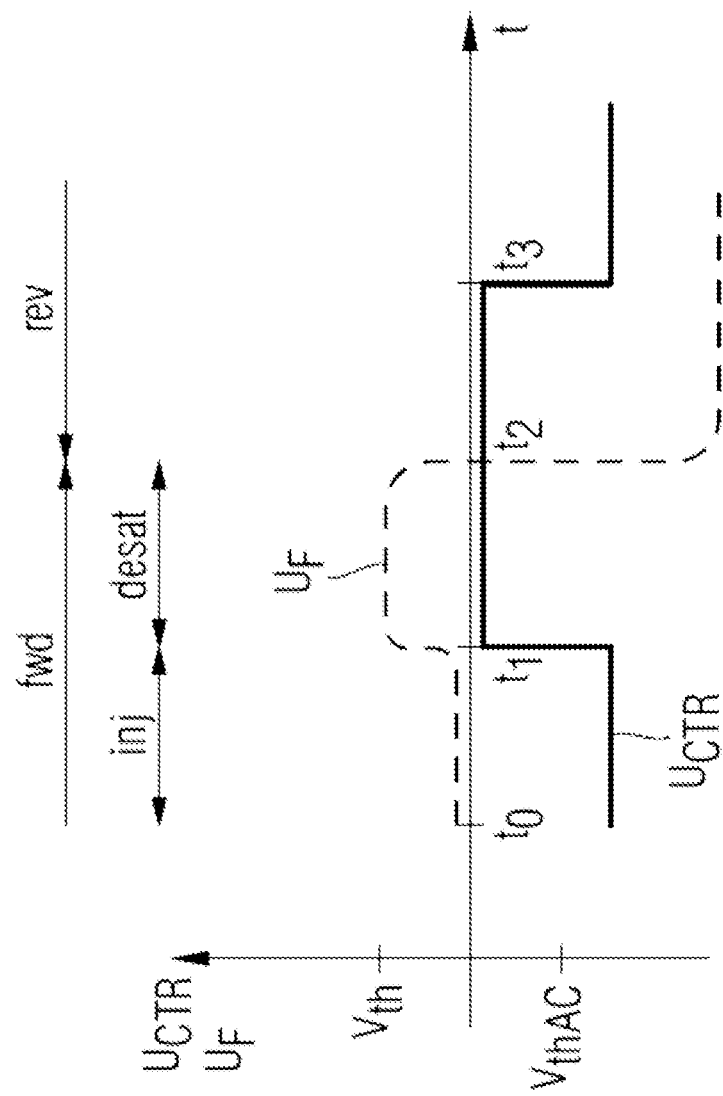
FIG. 2B is a schematic timing diagram illustrating a method of operating the semiconductor diode of FIG. 2A.

FIG. 2B shows a timing diagram of a control signal $U_{CTR}$ applied to the control electrodes 189, e.g., through the control terminal CTR. In an injection period between t0 and t1 the control signal $U_{CTR}$ is lower than the first threshold voltage $V_{thAC}$ such that p-type inversion layers 184 along the control structures 180 increase the effective anode area. A charge carrier plasma in the drift region 120 is high and the effective forward resistance as well as the forward voltage $U_F$ are low. During a desaturation period between t1 and t2, the voltage of the control signal $U_{CTR}$ is above the first threshold $V_{thAC}$ and may be below the second threshold voltage $V_{th}$. No inversion layers are formed and the effective anode emitter area is small. The charge carrier plasma is attenuated resulting in an increased forward voltage $U_F$.

When the semiconductor diode commutates and switches to the reverse blocking mode at t2, the reverse recovery charge is low and switching losses are reduced. Before the semiconductor diode 501 switches back to the forward biased mode, the control voltage $U_{CTR}$ can be decreased to below the first threshold voltage $V_{thAC}$ at t3 during the reverse blocking mode.

Compared to approaches aiming at reducing the effective anode dose for providing a high spread between the high and low anode emitter efficiency states, the barrier region 117 allows for higher anode doses which are easier to control during manufacture.

The RC-IGBT 502 in FIG. 3A includes controllable auxiliary cells AC as described with reference to FIG. 1 and FIG. 2A, wherein the first load terminal 310 is electrically connected to an emitter terminal E, the second load terminal 320 is electrically connected to a collector terminal C and the pedestal layer 130 includes first zones 131 of the first conductivity type and second zones 132 of the second conductivity type, wherein the first and second zones 131, 132 are sandwiched between the drift region 120 and the second load electrode 320, respectively.

In addition to the auxiliary cells AC the RC-IGBT 502 includes transistor cells TC and may or may not include idle cells IC. Each transistor cell TC includes a transistor mesa section 192 of the semiconductor body 100 as well as a gate structure 150 extending from the first surface 101 into the semiconductor body 100. The gate structure 150 includes a conductive gate electrode 159 and a gate dielectric 155 insulating the gate electrode 159 from the surrounding material of the semiconductor body 100.

Shape and size of the gate structures 150 may correspond to, for example, may be equal to the shape and size of the control structures 180. The gate and control dielectrics 155, 185 may have the same thickness and may be provided from the same material(s). Lateral and vertical extensions of the gate electrodes 159, may be the same as those for the control electrodes 189. Gate and control electrodes 159, 189 may be provided from the same material(s). A gate top dielectric 158 may separate the gate electrode 159 from the first surface 101.

The transistor mesa section 192 includes a p-type body region 115a forming a pn junction with the drift region 120, wherein the body regions 115a may approximately correspond to the charge carrier transfer regions 115 of the auxiliary cells AC. For example, a mean impurity concentration and a vertical extension of the body regions 115a of the transistor cells TC may approximately correspond or may be equal to the mean impurity concentration and the vertical extension of the charge carrier transfer regions 115.

Each transistor cell TC includes a source region 110 in the transistor mesa section 192 between the top surface of the transistor mesa section 192 and the body region 115a at least in a portion of the transistor mesa section 192 that directly adjoins the gate structure 150 of the transistor cell TC. The transistor body regions 115a directly adjoin the drift region 120. The transistor mesa sections 192 may be devoid of a structure corresponding to the barrier region 117 of the auxiliary cells AC or may include a corresponding barrier region.

The semiconductor device 500 may further include idle cells IC including idle structures 190 which may correspond to the control structures 180 of the auxiliary cells AC and/or the gate structures 150 of the transistor cells TC. Idle mesa sections 196 adjoining the idle structures 190 may be devoid of regions corresponding to the charge carrier transfer and body regions 115, 115a, the source regions 110, and/or the barrier region 117. The idle mesa sections 196 may or may not be electrically connected to the first load electrode 310.

The control electrodes 180 of the auxiliary cells AC may be electrically connected to each other and to an output of an internal circuit or to a control terminal CTR of the RC-IGBT 502. The control electrodes 195 of the idle cells IC may be electrically connected or coupled to the control electrodes 180 of the auxiliary cells AC, to the gate electrodes 150 of the transistor cells TC, to the first load electrode 310 or to any other internal network node of the RC-IGBT 502.

The semiconductor device 502 is arranged not to form an inversion path through the charge carrier transfer region 115. For example, the control electrode 180 is not connected to a network node to which a signal is applied that exceeds a threshold voltage for formation of an n-type inversion layer in a p-type charge carrier transfer region 115. Alternatively, the top dielectric 188 may overlap with the charge carrier transfer region 115 along the vertical direction or the auxiliary mesa section 194 is devoid of a source region between the first surface 101 and the charge carrier transfer region 115.

The RC-IGBT 502 is in the forward mode when a positive collector-to-emitter voltage $U_{CE}$ is applied between the collector and emitter terminals C, E. If a voltage applied to the gate electrode 150 exceeds the threshold voltage $V_{th}$ for the transistor cells TC, an n-type inversion channel is formed through the body region 115a and a current flow through the body regions 115a opens the pnp bipolar junction transistor formed by the body region 115a, the drift region 120 and the p-type second zones 132 in the pedestal layer 130 in the forward conducting mode.

In the complementary forward blocking mode, the voltage applied to the gate electrode 150 is below the threshold voltage $V_{th}$ of the transistor cells TC and the reverse biased pn junction between the body and drift regions 115a, 120 accommodates the forward blocking voltage.

In the reverse conducting or diode mode a negative collector-to-emitter voltage $U_{CE}$ applied between the collector and emitter electrodes forward biases the pn junctions between the body and drift regions 115a, 120 as well as between the charge carrier transfer and drift regions 115, 120. During an injection period of the diode mode a negative voltage of the control signal $U_{CTR}$ below the first threshold voltage $V_{thAC}$ induces p-type inversion layers 184 in the barrier and drift regions 117, 120 along the control structures 180. The inversion layers 184 increase the active anode area and the total anode emitter efficiency.

In a subsequent desaturation period, the voltage of the control signal $U_{CTR}$ is higher than the first threshold voltage $V_{thAC}$ such that the total effective anode emitter efficiency is reduced. Desaturation is decoupled from a voltage applied to the gate electrodes 159. Commutating from the reverse conducting mode to the forward blocking mode can directly follow the desaturation period without any time lag between the end of the desaturation period and the start of the commutation.

By contrast, conventional approaches rely on a desaturation period applied to a gate electrode and inducing n-type inversion channels through the body regions 115a, wherein the n-type inversion channels short-circuit the p-type body and charge carrier transfer regions 115a, 115 to drastically reduce the total anode emitter efficiency. Since the n-type inversion channel prevents a transistor cell TC from accommodating a high blocking voltage in applications as, for example, half-bridge circuits, a sufficient time lag has to be provided between the end of the desaturation period and the start of the commutation. Since the charge carrier plasma at least partially restores during the time lag, the time lag deteriorates the overall desaturation performance.

Furthermore, in conventional RC-IGBTs some regions have to remain active as injecting charge carrier transfer regions during a desaturation period in order to maintain a minimum reverse conductivity even when the short-circuited body regions 115a do not inject any charges. Therefore, in conventional designs the anode efficiency of additional injecting regions has to be carefully tuned such that both the number of holes injected into the drift region 120 remains sufficiently high during the desaturation period and desaturation efficiency remains sufficiently high.

Current methods for reducing the anode efficiency in the injection regions aim at reducing the effective anode dose in the charge carrier transfer regions 115, for example by reducing the implant dose and/or removing portions of the charge carrier transfer regions 115 after the implant. However, reliably controlling a small anode dose has turned out to be a delicate process with low yield. Instead, the barrier regions 117 reduce the anode emitter efficiency of the auxiliary cells AC without reducing the effective anode dose in the charge carrier transfer regions 115, thereby avoiding critical processes with low yield.

In addition the barrier regions 117 provide a potential barrier for the holes in the charge carrier plasma and significantly reduce the negative impact of the auxiliary cells AC on the device performance in the IGBT mode.

The transistor cells TC may be provided with or without the barrier region 117 or any other region of the first conductivity type corresponding to the barrier region 117 in the auxiliary cells AC. According to an embodiment, the transistor cells TC may be devoid of the barrier region 117 or any similar region such that the transistor cells TC remain unaffected by the design of the auxiliary cells AC.

Figure 3A:
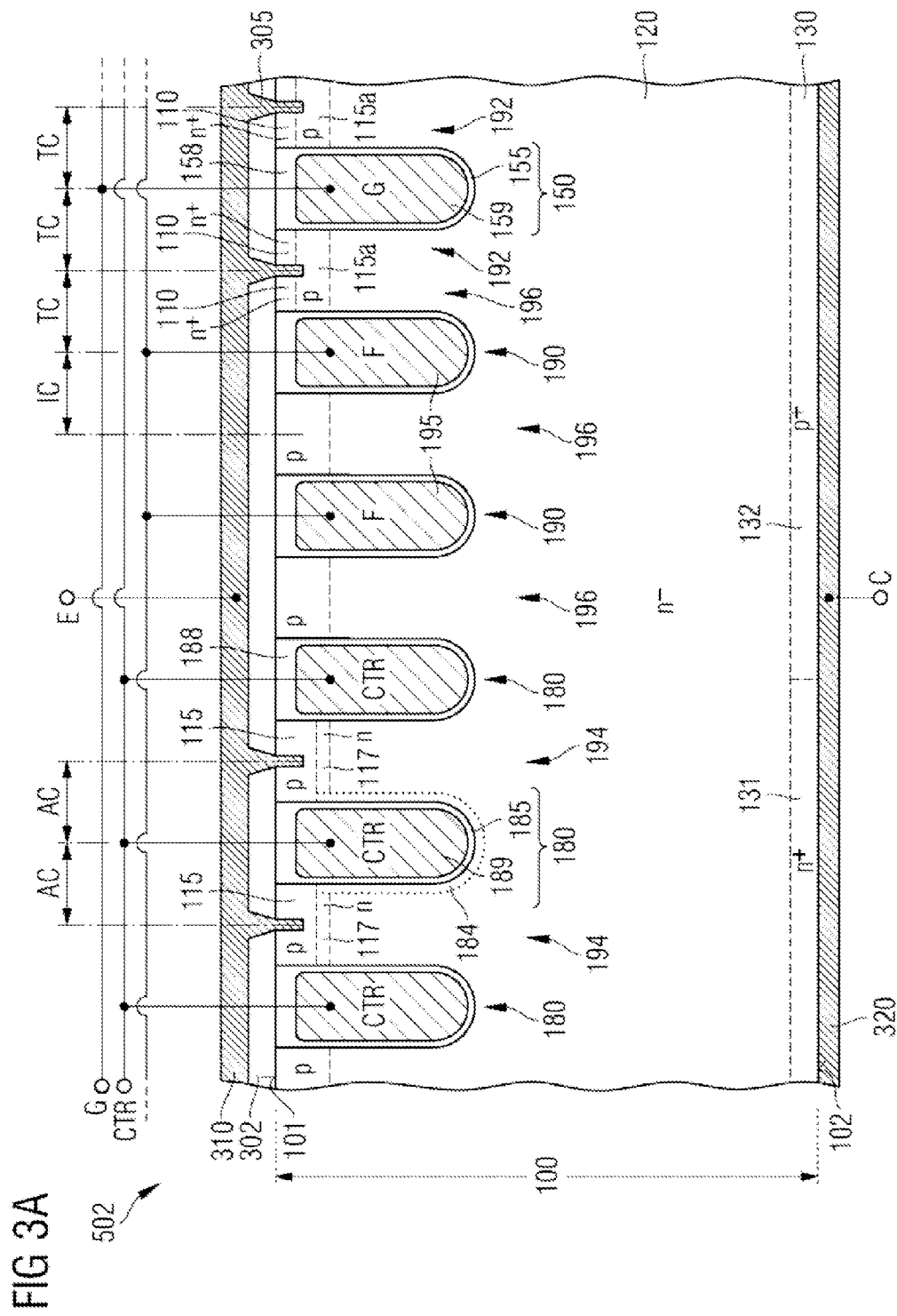
FIG. 3A is a schematic cross-sectional view of a portion of an RC-IGBT (reverse conducting IGBT) with controllable injection cells according to an embodiment providing separated control of injection and transistor cells.
Figure 3B:
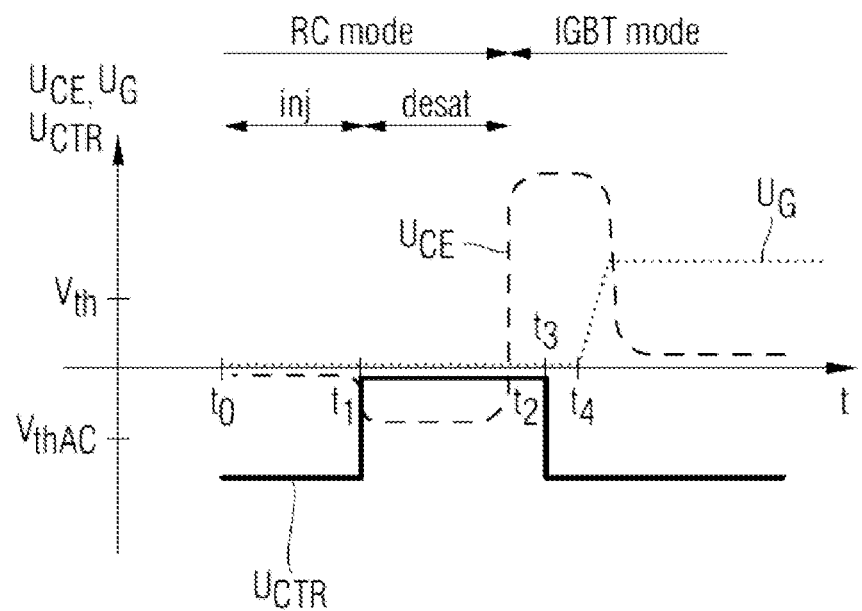
FIG. 3B is a schematic timing diagram illustrating a method of operating the RC-IGBT of FIG. 3A.

FIG. 3B schematically shows the transition from the injection to the desaturation period at t1 as well as the start of the commutation of the integrated free-wheeling diode with the change from the negative collector-to-emitter voltage $U_{CE}$ to a positive voltage $U_{CE}$ at t2. Opening the n-type channels in the transistor cells TC by applying a gate signal $U_G$ with a voltage higher than the threshold voltage $V_{th}$ of the transistor cells TC is decoupled from the desaturation period. At the start of the commutation no n-type inversion channel providing a charge carrier path exists even if the commutation overlaps the desaturation period.

Figure 4B:
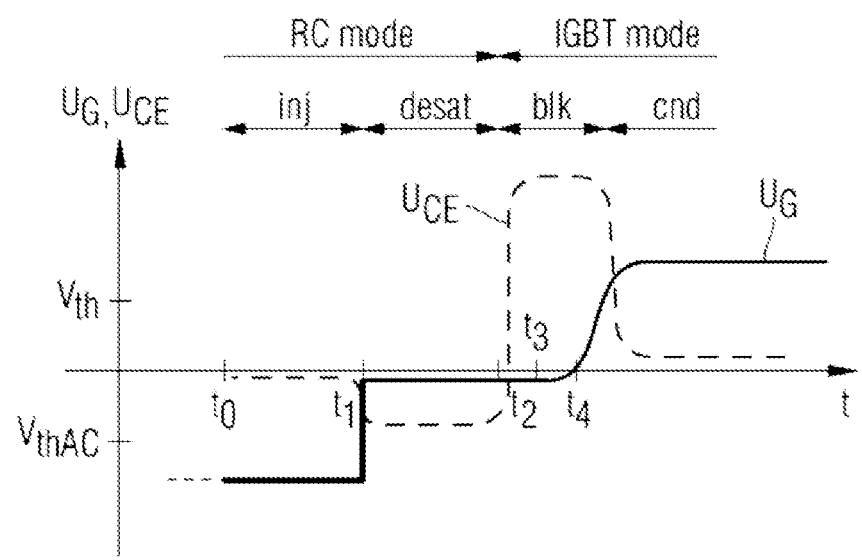
FIG. 4B is a schematic timing diagram illustrating a method of operating the RC-IGBT of FIG. 4A.
Figure 4A:
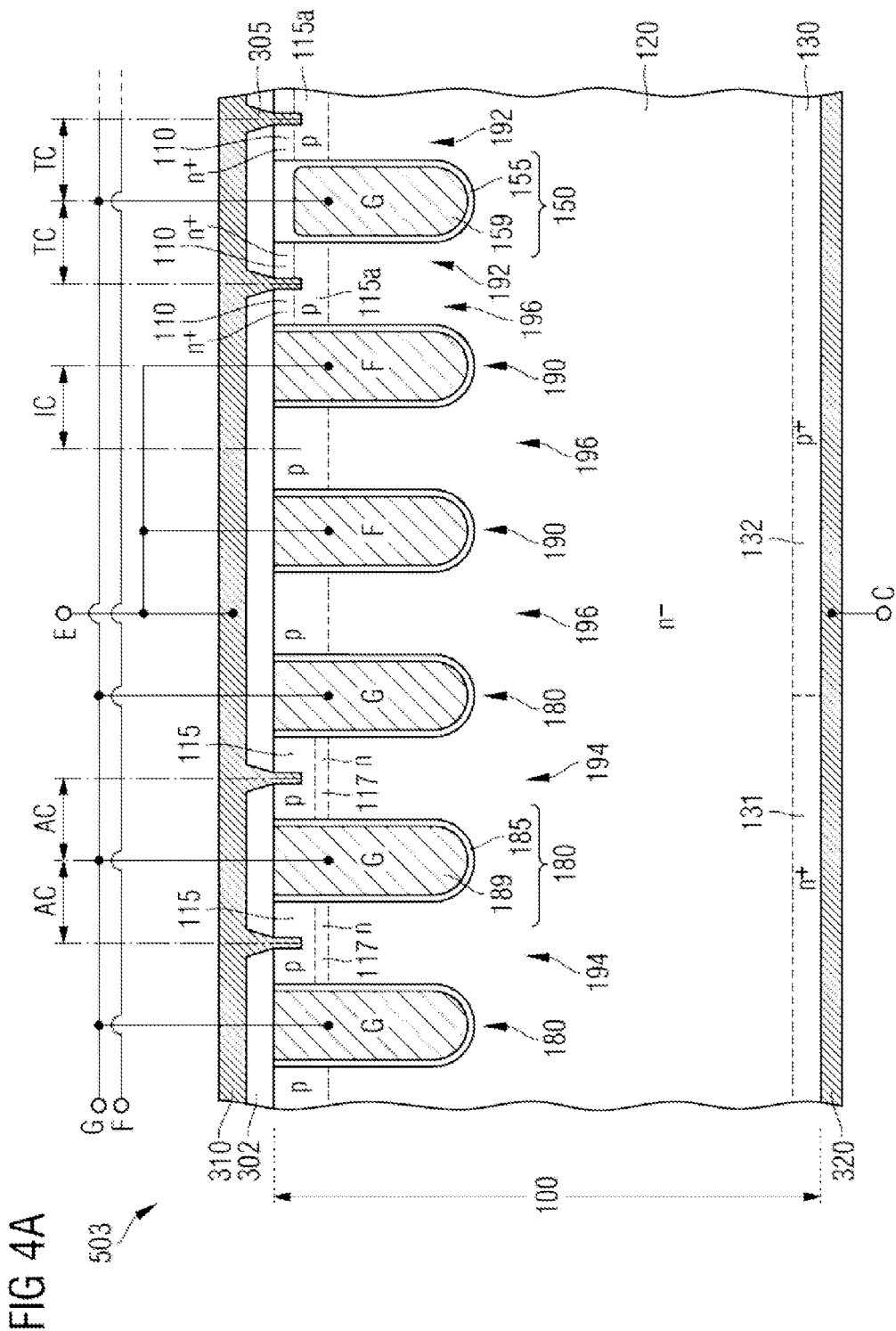
FIG. 4A is a schematic cross-sectional view of a portion of an RC-IGBT with controllable injection cells according to an embodiment providing collective control of injection and transistor cells.

The RC-IGBT 503 of FIG. 4A distinguishes from the RC-IGBT 502 of FIG. 3A in that the gate and control electrodes 150, 180 are electrically connected to each other. The gate and control electrodes 150, 180 may be electrically connected to a gate terminal G or to an internal network node of the RC-IGBT 503, for example to an output of a driver or delay circuit. The auxiliary cells AC are arranged not to form an inversion current path through the charge carrier transfer region 115 when a voltage of the gate signal $U_G$ applied to the gate and control electrodes 150, 180 exceeds the threshold voltage $V_{th}$ of the transistor cells TC. For example, a top dielectric between the first surface 101 and the control electrode 180 may overlap with the charge carrier transfer region 115 along the vertical direction or the auxiliary mesa section 194 is devoid of a source region between the first surface 101 and the charge carrier transfer region 115.

According to an embodiment, the barrier region 117 contains at least one deep level donor or deep double donor, e.g., sulfur (S) and/or selenium (Se) atoms/ions. With deep level donors, the doping level increases with increasing temperature, wherein the increasing doping level reduces anode emitter efficiency and thus counteracts an inhomogeneous current distribution among parallel auxiliary cells AC.

FIG. 4B shows a timing diagram illustrating a mode of operation of the RC-IGBT 503 of FIG. 4A. At a voltage of the gate signal $U_G$ below the first threshold voltage of the auxiliary cells $V_{thAC}$, for example, at $U_G = -15V$, the effective anode area of the RC-IGBT 503 in the reverse conducting mode is significantly increased and the RC-IGBT 503 is in an injection mode.

At t1 the voltage of the gate signal $U_G$ is increased to above the threshold voltage $V_{thAC}$ of the auxiliary cells AC and below the threshold voltage $V_{th}$ of the transistor cells TC to start a desaturation period. Controlling the anode efficiency of the auxiliary cells AC at the desaturation voltage may achieve a significant effect for an ample range of a ratio of auxiliary cells AC to transistor cells TC, e.g., in a range from 1:10 to 10:1. The device retains its full reverse blocking capability during the desaturation. A time lag between the end of the desaturation period and the start of the commutation of the RC-IGBT 503 can be completely omitted without the risk of provoking a short-circuit condition. The omission of the time lag results in a highly effective desaturation.

FIG. 4C shows an RC-IGBT 504 with four auxiliary cells AC and ten idle cells IC per each two transistor cells TC. The auxiliary and transistor cells AC, TC are controlled by the same gate signal $U_G$. Idle electrodes of the idle control cells IC may be connected to the potential of the emitter electrode represented by the first load electrode 310. The transistor mesa sections 192 of the transistor cells TC include source regions 110. Between the drift and body regions 120, 115a the transistor cells TC are devoid of barrier regions or other regions of the first conductivity type having a higher impurity concentration than the drift region 120. The auxiliary cells AC are devoid of source regions or other regions of the first conductivity type between the first surface 101 and the charge carrier transfer regions 115. The idle cells IC may be devoid of any of the regions of the auxiliary and transistor cells AC, TC and/or are not connected to the first load electrode 310 such that they are neither effective as auxiliary cells AC nor as transistor cells TC.

Auxiliary mesa sections 194 adjoining control structures 180 include buried barrier regions 117 that extend over the complete lateral cross-sectional areas of the auxiliary mesa sections 194. At least such idle control structures 190 that adjoin the transistor cells TC may be electrically connected to the emitter potential to reduce feedback effects of a high current on the gate potential during IGBT switching.

Figure 4D:
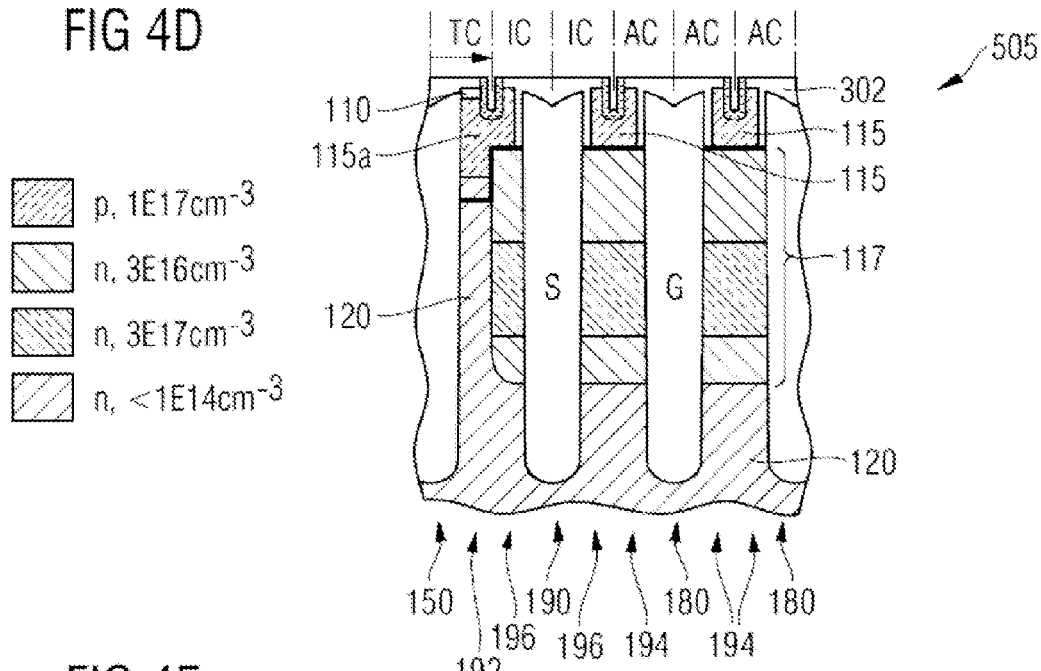
FIG. 4D is a schematic cross-sectional view of a portion of an RC-IGBT according to an embodiment providing collectively controllable auxiliary and transistor cells as well as idle cells.

FIG. 4D refers to a further RC-IGBT 505 with a transistor cell TC, idle cells IC and auxiliary cells AC. To avoid a huge hole injection in the mesa neighboring the transistor cell TC at 0V, a half barrier region 117 may be implemented in the concerned mesa resulting in a transistor mesa section 192 oriented to the gate structure 150 and an idle mesa section 196 along the idle structure 190. In IGBTs that use shadowed regions in a lateral direction perpendicular to the cross-sectional plane to limit the short circuit current, a full buried region 170 may be implemented in the shadowed areas. The table gives the peak impurity concentrations in the body region 115a, sections of the barrier region 117 and the drift region 120.

Figure 4E:
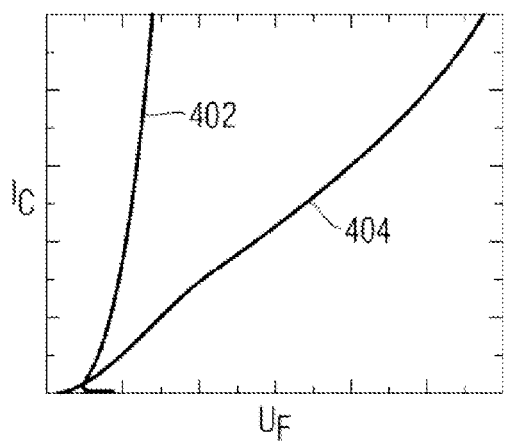
FIG. 4E is a schematic diagram showing the diode characteristics of the RC-IGBT of FIG. 4D in a reverse conducting mode at different gate voltages.

FIG. 4E schematically shows the diode characteristic 402 of the reverse conducting diode of the RC-IGBT 505 of FIG. 4D at $U_G$=−15V and the diode characteristic 404 in the desaturation mode at a gate voltage $U_G$=0V at an impurity dose in the n-type barrier region 117 of 3×10$^{12}$ (3E12) cm$^{-2}$. The significant increase of the forward voltage $U_F$ of the reverse diode at an increase of the gate voltage $U_G$ from −15V to 0V indicates a significant reduction of the charge carrier plasma in the drift region 120 and, as a consequence, a huge reduction of the reverse recovery charge.

Figure 4F:
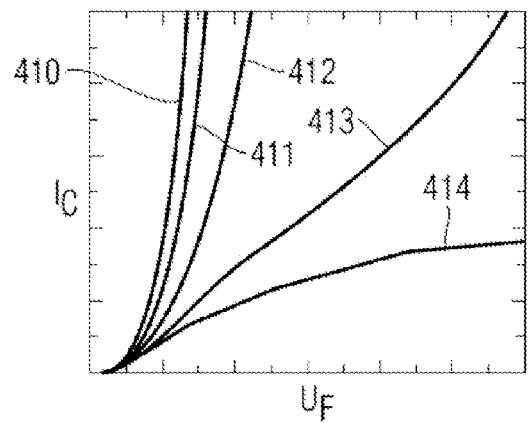
FIG. 4F is a schematic diagram showing the diode characteristics of the RC-IGBT of FIG. 4D in the reverse conducting mode at various implant doses for a barrier region.

FIG. 4F shows the diode characteristics 411-414 of the reverse conducting diode in the RC-IGBT 505 of FIG. 4D at an impurity dose for the barrier layer 170 of 1×10$^{13}$ (1E13) cm$^{-2}$, 2×10$^{13}$ (2E13) cm$^{-2}$, 3×10$^{13}$ (3E13) cm$^{-2}$ and 4×10$^{13}$ (4E13)cm$^2$ at $U_G$=0V. The diode characteristic 410 is that of a reference example without any barrier region 170. For a given load current, the collector-to-emitter voltage $U_{CE}$ increases with increasing impurity dose in the barrier region 170. An implant dose of the barrier region 170 adjusts the forward voltage $U_F$ and hence the reverse recovery charge.

Figure 5A:
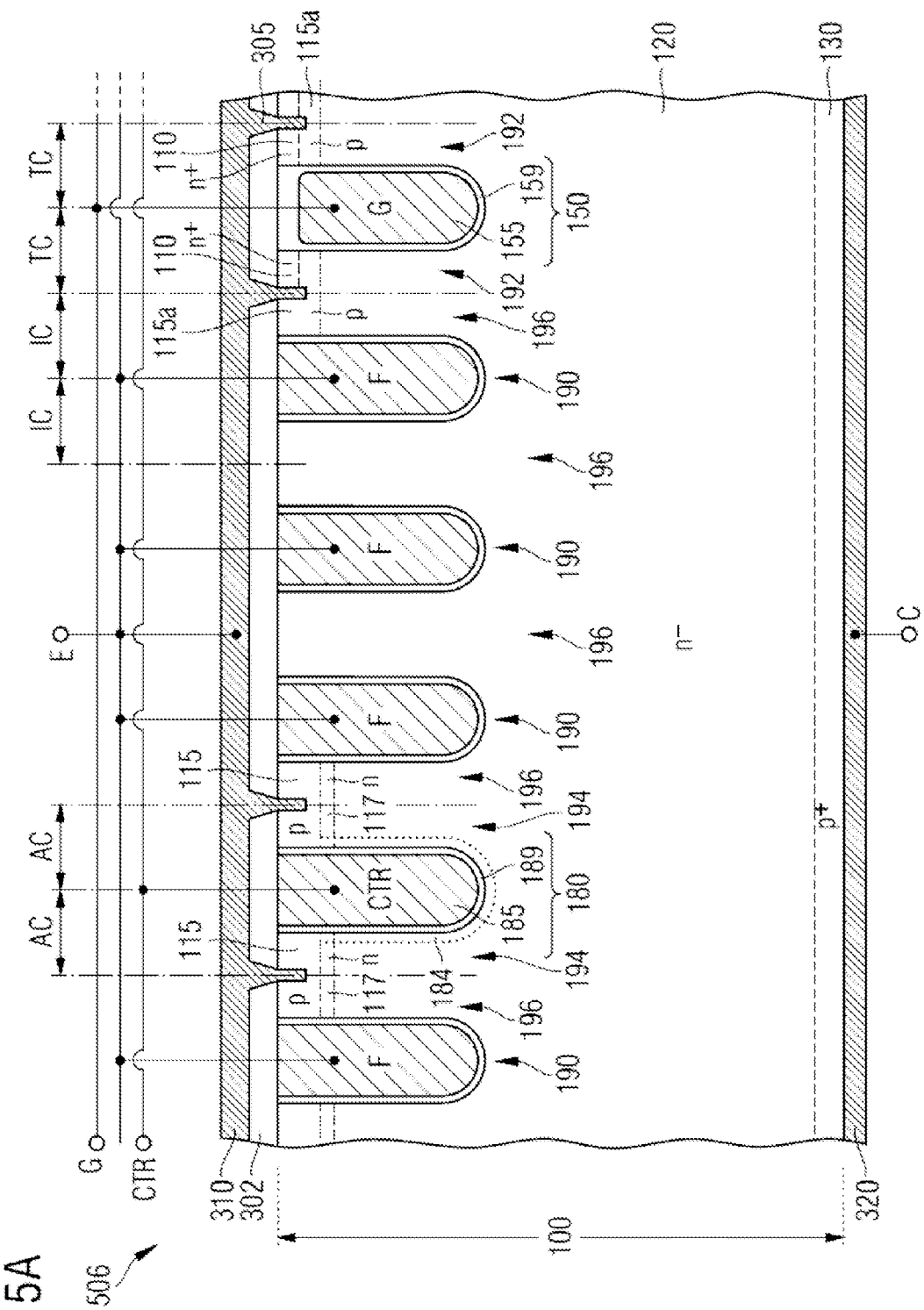
FIG. 5A is a schematic cross-sectional view of a portion of a non RC-IGBT according to another embodiment providing separate control of desaturation and transistor cells.

FIG. 5A refers to a non-reverse conducting IGBT 506, i.e. an IGBT without integrated reverse conducting or freewheeling diode differing from the RC-IGBT 502 of FIG. 3A and FIG. 3B in that the pedestal layer 130 forms a contiguous collector layer of the second conductivity type. The IGBT 506 includes transistor cells TC and auxiliary cells AC and may include idle cells IC as described above. A gate signal $U_G$ controls the transistor cells TC and a control signal $U_{CTR}$ controls the auxiliary cells AC. The emitter potential or any other internal potential not subject to the gate voltage $U_G$ and the control voltage $U_{CTR}$ may control the idle cells IC.

FIG. 5B illustrates a method of operating the IGBT 506 of FIG. 5A at reduced switching losses.

During an on-state of the IGBT 506, the gate potential $U_G$ is above the threshold voltage $V_{th}$ of the transistor cells TC and an n-type inversion layer through the body regions 115a injects electrons into the drift region 120 in an accumulation period. The p-type pedestal layer 130 injects holes into the drift region 120 and a resulting dense charge carrier plasma ensures a low collector-to-emitter saturation voltage $V_{CEsat}$.

At t1, the voltage of the control signal $U_{CTR}$ is lowered below the first threshold voltage $V_{thAC}$ of the auxiliary cells AC to start a desaturation period. P-type inversion layers 184 along the control structure 180 extract holes from the drift region 120 through the charge carrier transfer regions 115 of the auxiliary cells AC to the first load electrode 310.

At t2, the voltage of the gate signal $U_G$ may fall below the threshold voltage $V_{th}$ of the transistor cells TC and the IGBT changes from the forward conducting state or on state to the forward blocking state or off state. During forward conduction the IGBT 506 is switched from a state with high carrier-confinement with low $V_{CEsat}$ and high $E_{off}$ to a state with low carrier-confinement with high $V_{CEsat}$ and low $E_{off}$ shortly before turn-off.

Typically the effective channel width of an IGBT is kept low in order to increase short circuit robustness such that active transistor cells TC are formed only in a portion of an active area of the IGBT 506. The auxiliary cells AC make use of a chip area which otherwise would be unused and do not require additional chip area.

In the IGBTs 507 to 510 of FIG. 6A, FIG. 6C, FIG. 6D and FIG. 6E the same gate signal controls both the auxiliary cells AC and the transistor cells TC.

The non RC-IGBT 507 of FIG. 6A differs from the non RC-IGBT 506 of FIG. 5A to FIG. 5B in that a constant voltage offset is applied between the control electrodes 159 of the transistor cells TC and the control electrodes 189 of the auxiliary cells AC. For example, a voltage shifter VS may be provided between the gate terminal G and a wiring line connecting the control electrodes 189. The RC-IGBT 506 may include a first semiconductor die with the semiconductor body 100 including the transistor and auxiliary cells TC, AC and a second semiconductor die including the voltage shifter VS. The semiconductor dies may be connected in a chip-on-chip technology. According to another embodiment the RC-IGBT 506 is a module including a printed circuit board or a carrier onto which two or more semiconductor dies are mounted, e.g., soldered.

According to another embodiment the IGBT 507 includes both a gate terminal G electrically connected to the gate electrodes 150 and a control terminal electrically connected to the control electrodes 189, wherein an external circuit applies a voltage-shifted version of the signal applied to the gate terminal G to the control terminal.

The offset voltage virtually shifts the threshold voltages of the auxiliary cells AC with regard to the gate potential applied to the gate electrodes. The virtually or actually shifted threshold voltages of the auxiliary cells AC allow the desaturation to be controlled by a three-level gate driver circuit integrated on the same semiconductor die as the IGBT or provided as a separate device whose output is electrically connected to the gate terminal G of the IGBTs 507 to 509 in FIGS. 6A, 6C, 6D.

The shifted threshold voltages of the auxiliary cells AC and the transistor cells TC are selected such that during an on state of the transistor cells TC the auxiliary cells AC may change from a non-inversion state without p-type inversion layers in the barrier and drift regions 117, 120 to an inversion state with p-type inversion layers in the barrier and drift regions 117, 120. According to an embodiment referring to n-channel IGBTs, the threshold voltage $V_{thAC}$ of the auxiliary cells AC is set above the threshold voltage $V_{th}$ of the transistor cells TC.

Figure 6B:
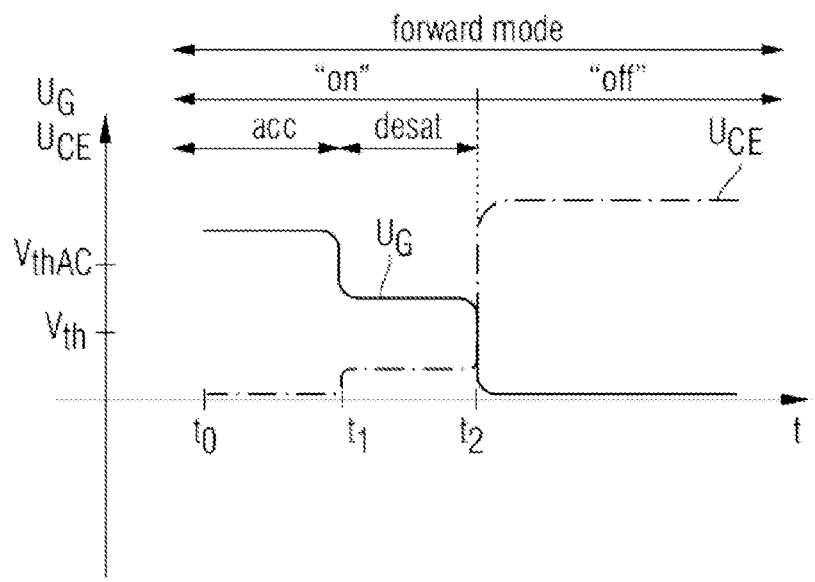
FIG. 6B is a schematic timing diagram for illustrating a method of operating the non RC-IGBT of FIG. 6A.

The timing diagram in FIG. 6B shows a high plasma density state or accumulation state between t0 and t1, when the voltage of the gate signal $U_G$ is above both the threshold voltage $V_{th}$ of the transistor cells TC and the threshold voltage $V_{thAC}$ of the auxiliary cells AC. In a desaturation period between t1 and t2 the voltage of the gate signal $U_G$ is below the threshold voltage $V_{thAC}$ of the auxiliary cells but above the threshold voltage $V_{th}$. The transistor cells TC remain in the on-state while p-type inversion layers around the control structures 180 of the auxiliary cells AC desaturate the drift region 120. At t2 the voltage of the gate signal $U_G$ can directly transit from the voltage between the two threshold voltages $V_{th}$, $V_{thAC}$ to below the threshold voltage $V_{th}$, thereby switching off the transistor cells TC. The desaturation period reduces the charge in the drift region 120 right before the non RC-IGBT 507 of FIG. 6A is switched off. The desaturation significantly reduces switching losses.

Figure 6C:
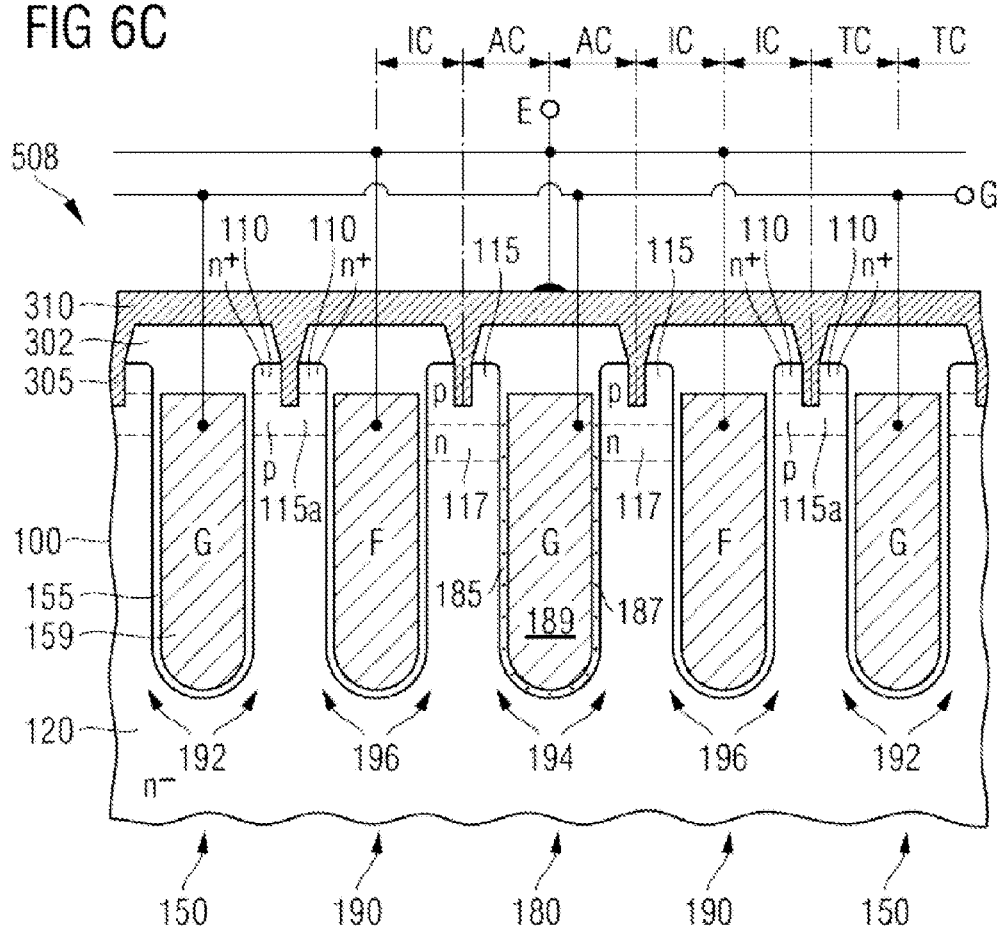
FIG. 6C is a schematic cross-sectional view of a portion of a semiconductor device in accordance with a further embodiment related to non RC-IGBTs with collectively controlled desaturation and transistor cells using control dielectrics containing fixed negative charges.

In the IGBTs 508, 509 of FIG. 6C, FIG. 6D, the control dielectrics 185 of the auxiliary cells AC and/or the gate dielectrics 155 of the transistor cells TC may contain fixed and stable charges, for example, resulting from x-ray irradiation, electron bombardment or a high dose implant at low energy using, e.g., PLAD (plasma doping, plasma immersion ion implantation). Irradiation and electron bombardment generate deep and stable charge carrier traps in the material of the concerned dielectric material. According to another embodiment aluminum atoms may be implanted or deposited through ALD (atomic layer deposition). An array concentration of the aluminum atoms/ions may be at least 5E11 cm$^{-2}$, for example at least 1E12 cm$^{-2}$, or may be in the range close to 5E12 cm$^{-2}$, by way of example. Alternatively or in addition the control and gate electrodes 189, 159 may include different materials with different work functions with respect to the n-type semiconductor material.

In accordance with an embodiment, the control dielectrics 185 contain significantly more fixed and stable negative charges than the gate dielectrics 155 or the gate dielectrics 155 contain significantly more fixed and stable positive charges than the control dielectrics 185. According to an embodiment an area concentration of fixed and stable negative charges in the control dielectrics 185 is greater than 5E11 cm$^{-2}$, for example 1E12 cm$^{-2}$ or in the range of 5E12 cm$^{-2}$.

In addition or alternatively, the gate electrodes 159 are based on a heavily doped polycrystalline silicon and/or the control electrodes 189 are based on a metal-containing material whose work function results in a considerable band bending in the semiconductor body 100 such that the actual threshold voltage $V_{thAC}$ of the auxiliary cells AC may be set to a value between the threshold voltage $V_{th}$ of the transistor cells TC, which may be about +5V, and the maximum voltage available at the gate line, which may be +15V. In typical applications the threshold voltage $V_{thAC}$ may be set to +12V. A high conductive on-state or accumulation period at $U_G$=+15V may be followed by a desaturation period of, e.g., 3 µs at $U_G$=10V prior to a turn-off at $U_G$=0V or lower, e.g., $U_G$=−15V.

The IGBT 508 of FIG. 6C includes pairs of auxiliary cells AC, pairs of idle cells IC and pairs of transistor cells TC arranged in this order along at least one lateral direction. The cells of each cell pair are arranged mirror inverted to each other with respect to a vertical axis through the respective control or gate structure 150, 180, 190. The control dielectrics 189 contain stationary negative charges 187.

The IGBT 509 of FIG. 6D includes pairs of auxiliary cells AC and pairs of transistor cells TC arranged in this order along at least one lateral direction. The cells of each cell pair are arranged mirror inverted to each other with respect to a vertical axis through the respective auxiliary or transistor mesa section 192, 194. The control dielectrics 185 contain fixed stationary charges.

Figure 6E:
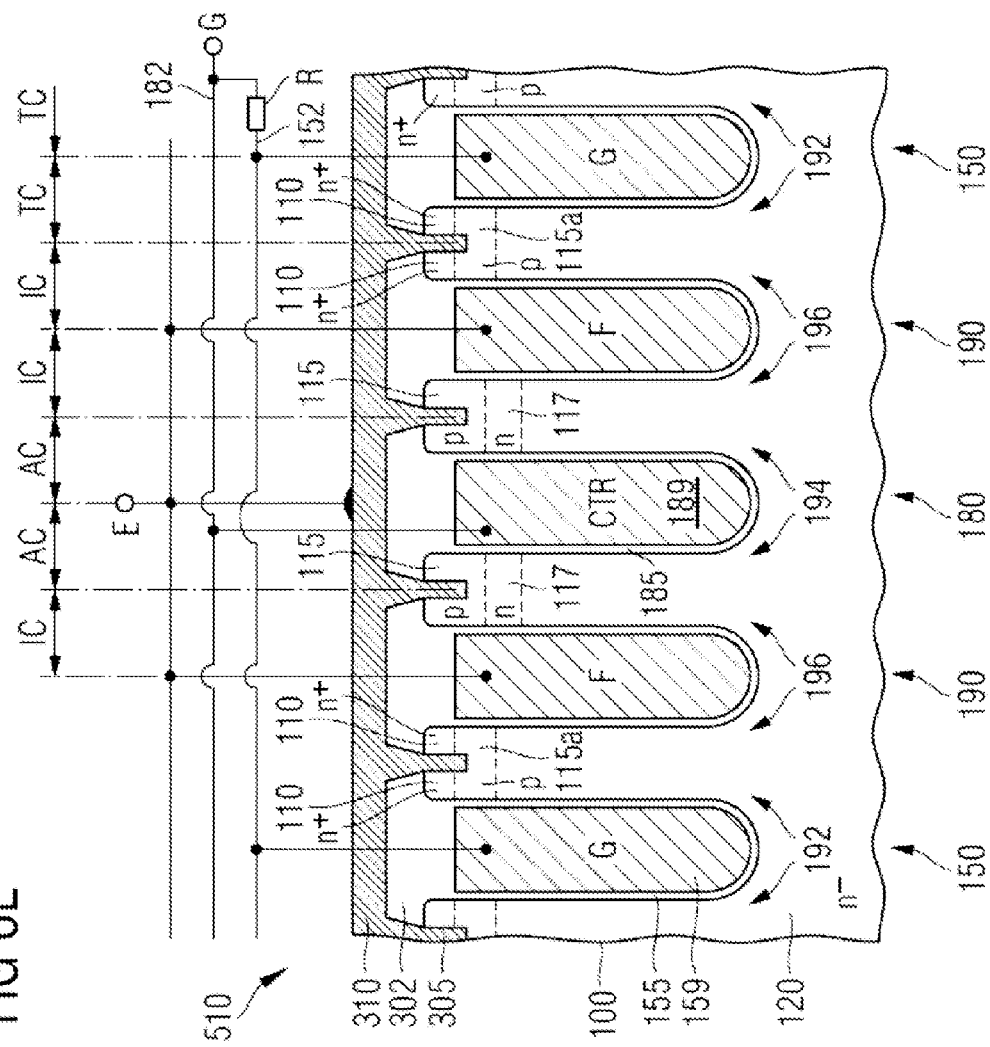
FIG. 6E is a schematic cross-sectional view of a portion of a non RC-IGBT with collectively controlled desaturation and transistor cells as well as a low-pass circuit.

The embodiment of FIG. 6E refers to an internal control of the desaturation period. For example, the gate electrodes 159 of the transistor cells TC may be electrically connected to a gate wiring line or node 152 and the control electrodes 189 of the auxiliary cells AC may be electrically connected to a control wiring line or node 182. The control wiring line 182 may be directly connected to the gate terminal G. A low-pass circuit between the gate terminal G and the gate wiring line 152 may delay the signal applied to the gate electrodes 159 with respect to the signal applied to the control electrodes 189. The delay defined by the low-pass circuit defines the length of the desaturation period t2–t1 of FIG. 6B. The low-pass circuit may consist of or include a serial resistor R between the gate wiring line 152 and the gate terminal G.

Figure 7:
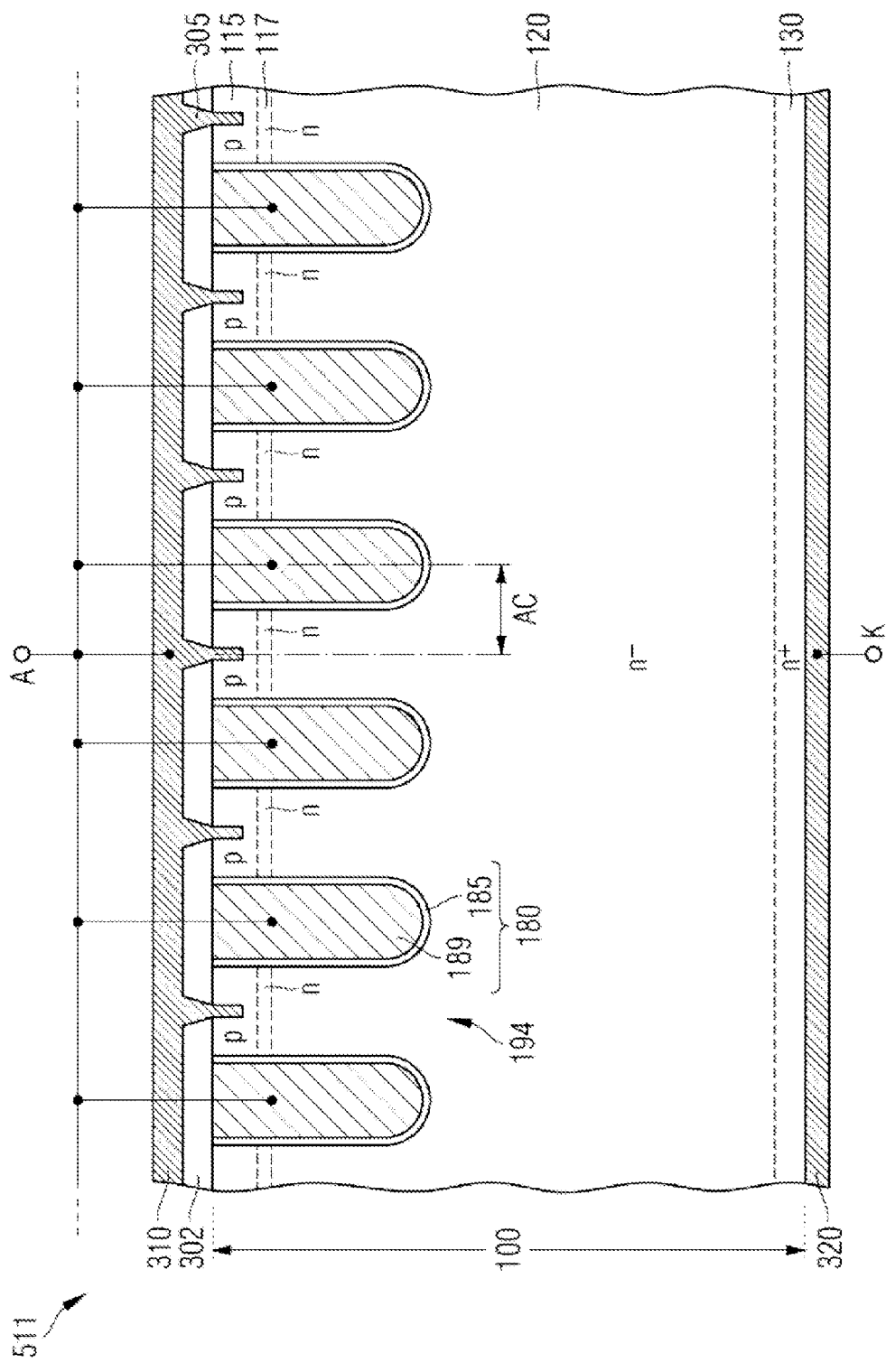
FIG. 7 is a schematic cross-sectional view of a portion of a semiconductor diode in accordance with an embodiment providing uncontrolled auxiliary cells.

The semiconductor diode 511 of FIG. 7 distinguishes from the semiconductor diode 501 of FIG. 2A in that the control electrodes 189 are electrically connected to a fixed potential, for example to the first load electrode 310. The barrier regions 117 allow the effective anode doping to be increased without increasing the charge carrier plasma in the semiconductor body during normal forward conduction. The control structures 180 may shape the electric field in the mesa portions in a suitable way.

Figure 8:
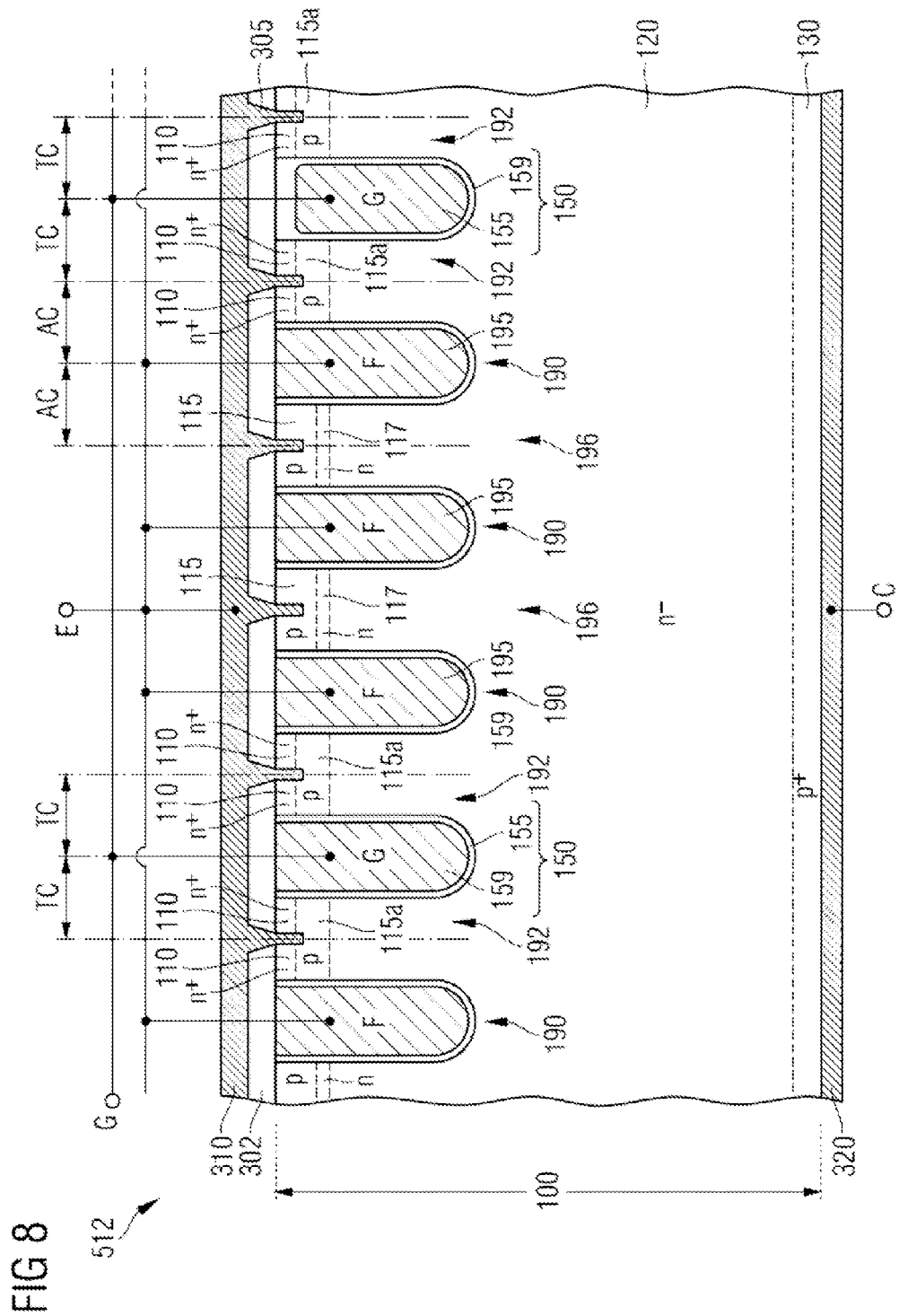
FIG. 8 is a cross-sectional view of a portion of an IGBT in accordance with embodiments providing uncontrolled auxiliary cells.

In FIG. 8 a non-desaturable, non RC-IGBT 512 includes idle auxiliary cells AC whose control electrodes 195 are electrically connected to a fixed potential, for example with the first load electrode 310. In the case of a sufficient high impurity concentration in the barrier regions 117, the idle auxiliary cells AC are inactive in the IGBT mode. On the other hand, more contact structures 305 directly connect the first load electrode 310 with the semiconductor body 100 such that a thermal coupling between the semiconductor body 100 and the first load electrode 310 is significantly increased with regard to conventional devices that typically do not provide any contact structures to the semiconductor regions of idle cells. The thermal behavior of the non-saturable non RC-IGBT 512 can be better adjusted to its electrical performance.

Driving RC-IGBTs, in Particular a Half-Bridge Arrangement Comprising RC-IGBTs

Figure 9A:
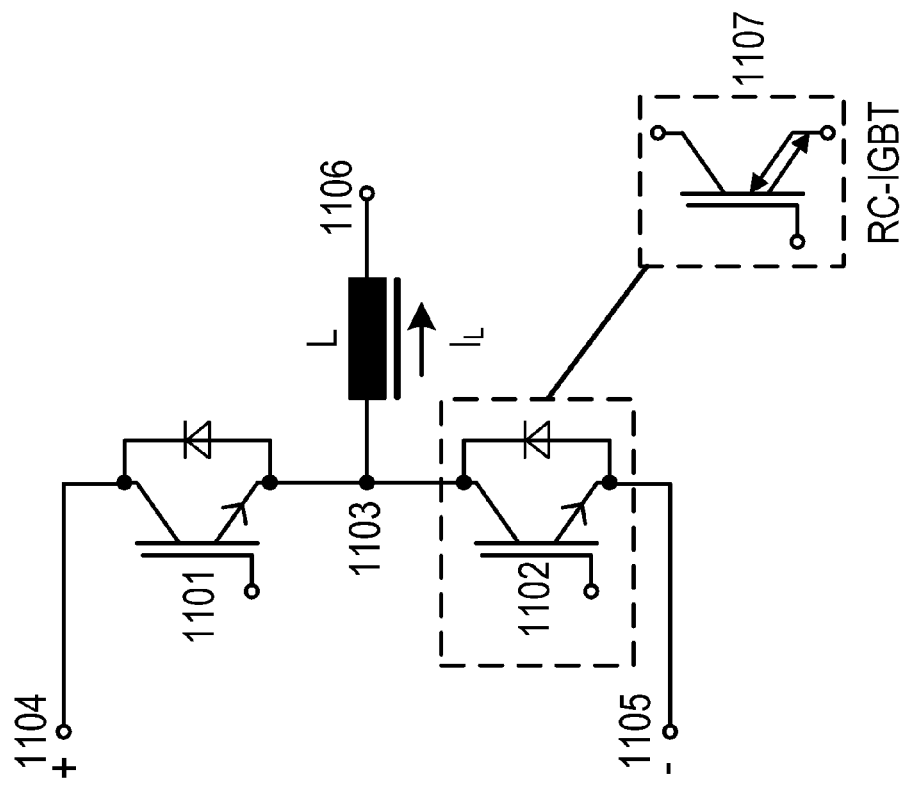
FIG. 9A shows a schematic diagram comprising a half-bridge arrangement comprising two RC-IGBTs and an inductor.

FIG. 9A shows a schematic diagram comprising a half-bridge arrangement comprising an RC-IGBT 1101 and an RC-IGBT 1102 and an inductor L. A terminal 1104 is connected to the collector of the RC-IGBT 1101. The emitter of the RC-IGBT 1101 is connected to a node 1103 and the node 1103 is connected to the collector of the RC-IGBT 1102. The emitter of the RC-IGBT 1102 is connected to a terminal 1105. The node 1103 is also connected via the inductor L to a terminal 1106.

Each RC-IGBT 1101, 1102 may be indicated as an IGBT with a diode arranged antiparallel to the collector-emitter path (i.e. the anode of the diode connected to the emitter and the cathode of the diode connected to the collector). The diode may in particular be a controllable diode. The RC-IGBT may also be depicted as a symbol 1107.

The terminal 1104 may be connected to a positive and the terminal 1105 may be connected to a negative voltage. An output of the half-bridge arrangement is provided at the terminal 1106.

Also, the gates of the RC-IGBTs 1101, 1102 may be controlled in order to operate the half-bridge arrangement. For such purpose, the gates of the RC-IGBTs 1101, 1102 may be driven by a separate circuitry, e.g., a microcontroller and/or a driver or the like.

It is noted that two half-bridge arrangement may be combined to a full-bridge (also referred to as H-bridge) arrangement.

Figure 9B:
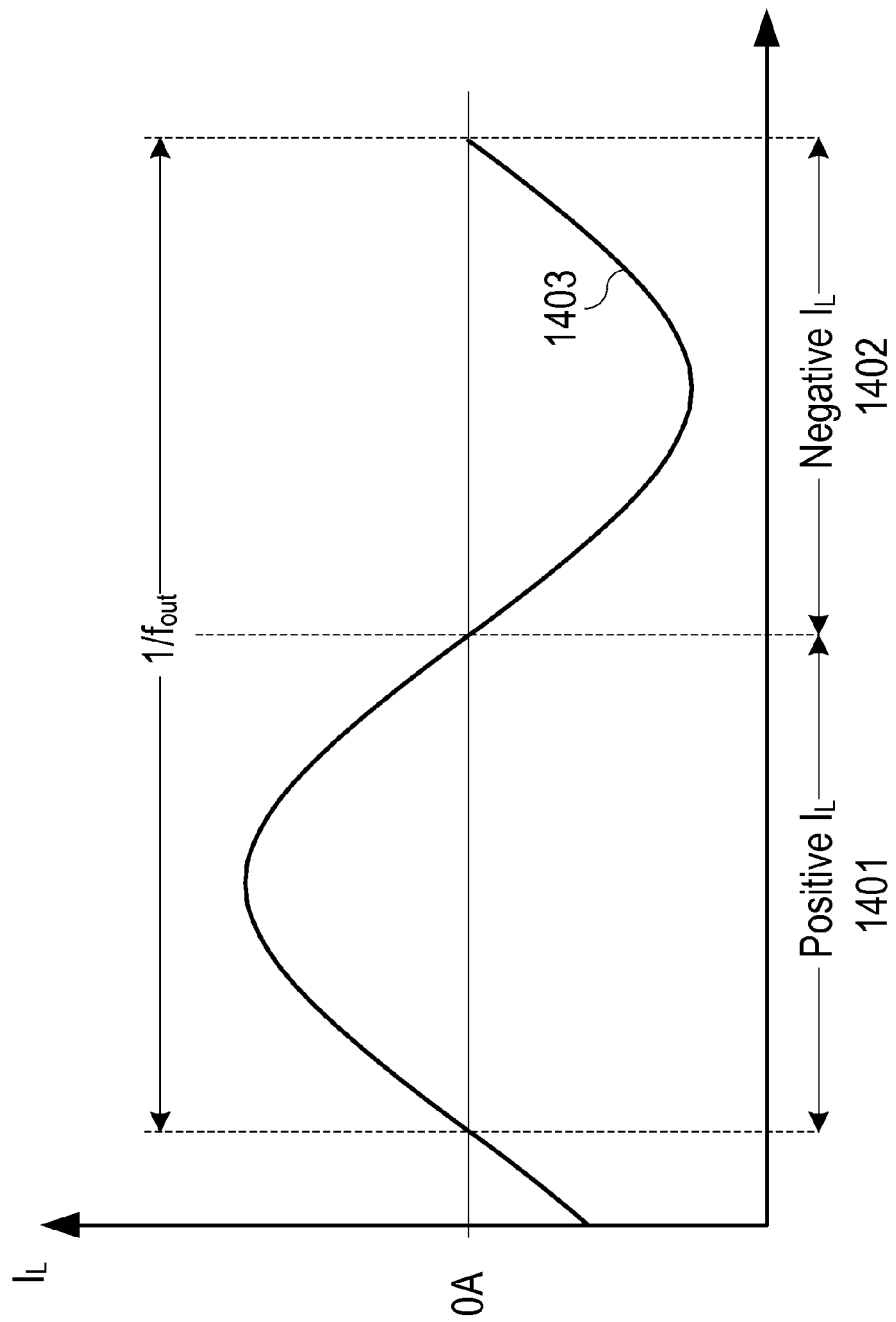
FIG. 9B shows a diagram depicting an exemplary load current $I_L$ across the inductor.

FIG. 9B shows a diagram depicting an exemplary load current $I_L$ 1403 across the inductor L. The load current $I_L$ 1403 comprises a positive portion 1401 and a negative portion 1402. FIG. 9B also depicts a duration of a period $1/f_{out}$, wherein the frequency $f_{out}$ may amount to, e.g., 50 Hz.

FIG. 10 shows a table comprising modes and states for an RC-IGBT, in particular a three-level RC-IGBTs (due to three different voltage levels or ranges of voltages applicable to its respective gate). A voltage across the collector and emitter of the RC-IGBT is referred to as $V_{ce}$ and a voltage at the gate of the RC-IGBT relative to its emitter is referred to as $V_g$. The voltages depicted in FIG. 10 are exemplary values and may change depending on the actual RC-IGBT and/or use case.

The voltage $V_{ce}$ indicates a mode of the RC-IGBT:
If the voltage $V_{ce}$ is larger than 0, the RC-IGBT is in an IGBT-mode (also referred to as "active").
If the voltage $V_{ce}$ is below 0, the RC-IGBT is in a DIODE-mode (also referred to as reverse-conducting mode). Entering the DIODE-mode may be a result of the other RC-IGBT being in the IGBT-mode; insofar, the RC-IGBT that is in the IGBT-mode may push the other RC-IGBT of the half-bridge arrangement into the DIODE-mode.

Dependent on the respective mode (IGBT-mode or DIODE-mode), the RC-IGBT may be controlled by applying voltages $V_g$ to its gate. This has an impact on a state of the RC-IGBT. In this example, three different voltages V1, V2 and V3 may be applied to the gate of the IGBT, wherein V1>V2>V3, in particular V2=0V, V1=+15V and V3=−15V. Hence, the following states can be determined:

When in the IGBT-mode, the RC-IGBT may be in a conducting state or in a blocking state. The RC-IGBT enters the conducting state in case the voltage V1 is applied to its gate. If the voltage V2 or V3 is applied to its gate, the RC-IGBT enters the blocking state.

When in the DIODE-mode, the following applies:
If the voltage V1 is applied, a high desaturation state is reached (very weak bipolar injection).
If the voltage V2 is applied, a low desaturation state is reached (in particular by weak bipolar injection).
If the voltage V3 is applied, an enhancement state is reached (in particular by strong bipolar injection).

In the DIODE-mode, the diode of the RC-IGBT is forward conducting in either the enhancement state or in any of the desaturation states. Switching between such states can be achieved by changing the voltage applied to the gate of the RC-IGBT.

It is noted that the RC-IGBT may be controlled by more than three voltages, which may result in at least one additional enhancement state and/or at least one additional desaturation state.

If the RC-IGBT is in the DIODE-mode and supplied with the voltage $V_g=-15V$ at its gate, it is in the enhancement state (see above). If the voltage $V_g$ changes to $V_g=0V$, the plasma concentration in the RC-IGBT decreases to a predetermined value, which results in a desaturation of the RC-IGBT. This may reduce the integral charge of the RC-IGBT by a factor in the range between 2 to 10 or even 100.

It is advantageous, however, that the RC-IGBT is robust against commutation. Also, the RC-IGBT may have to be robust enough for carrying predetermined load currents. It is therefore in particular advantageous to reduce losses by initiating the desaturation state prior to the commutation.

Hence, during the positive portion 1401 of the load current $I_L$ (see also FIG. 9B), the RC-IGBT 1101 is biased with a positive voltage $V_{ce}>0$ and it is either in the conducting state or in the blocking state. During the positive portion 1401, the RC-IGBT 1102 is biased with a positive or with a negative voltage in an alternating manner. During the negative portion 1402 of the load current $I_L$, the RC-IGBTs 1101 and 1102 change their roles. During a half-wave of the load current $I_L$, i.e. during the positive portion 1401 or during the negative portion 1402, a multitude (e.g., more than 20) of switching events (transitions from conducting state to blocking state or vice versa for the RC-IGBT being in the IGBT-mode) may occur. The switching frequency $f_{sw}$ is also visualized in FIG. 11. The switching frequency $f_{sw}$ may be in a range between 100 Hz to 30 kHz.

Hence, the controlling scheme suggested allows utilizing a supervised (multi-stage) desaturation in the DIODE-mode without the need for a lock time. Such minimum lock time was required for controlling the RC-IGBT to enter enhancement state before commutation.

Figure 11:
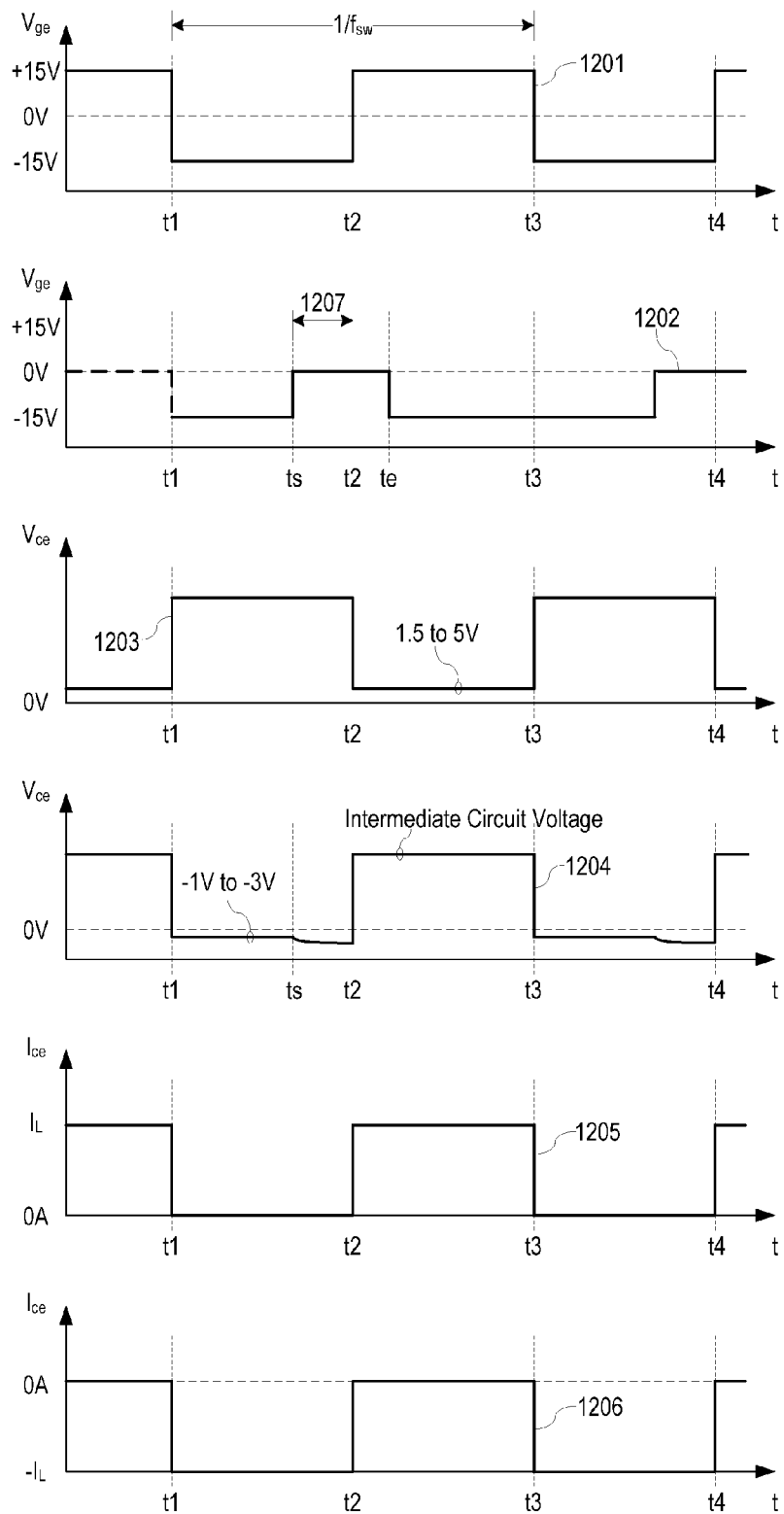
FIG. 11 shows timing diagram of the RC-IGBTs for a portion of a positive load current $I_L$.

FIG. 11 shows a timing diagram of the RC-IGBTs 1101 and 1102, which are arranged in a half-bridge arrangement according to FIG. 9A for a portion of a positive load current $I_L$.

In this example, the RC-IGBT 1101 is in the IGBT-mode. At a time t1, the RC-IGBT 1101 switches from the conducting state in the blocking state, at a time t2 it enters the conducting state and at a time t3 it enters the blocking state. A time difference between t1 and t3 indicates a switching rate amounting to $1/f_{sw}$ with $f_{sw}$ being a switching frequency.

A voltage $V_{ge}$ (which corresponds to the voltage $V_g$ mentioned above) between the gate and the emitter of the RC-IGBT 1101 is shown as a signal 1201 and a voltage $V_{ge}$ between the gate and the emitter of the RC-IGBT 1102 is shown as a signal 1202.

As an example shown in connection with the signal 1201, the voltage $V_{ge}$ in the conducting state amounts to +15V and the voltage $V_{ge}$ in the blocking state amounts to −15V. However, the voltage $V_{ge}$ during the blocking state may be set to any voltage between 0V and −15V or any voltage below the threshold voltage of the RC-IGBT.

Prior to the time t1, the RC-IGBT 1102 is in the blocking state of the IGBT-mode. When the signal 1202 shows a falling edge, the voltage $V_{ge}$ at the gate of the RC-IGBT 1102 changes from 0V to −15V. Hence, at the time t1, the RC-IGBT 1102 enters the enhancement state of the DIODE-mode. At a time ts, i.e. prior to the commutation (which occurs later at the time t2), the RC-IGBT 1102 still maintaining the DIODE-mode changes to the desaturation state based on a voltage amounting to 0V applied to its gate. The desaturation state is maintained during the commutation, i.e. across the time t2 and ends at a time te by falling back to the enhancement state.

It is an option that the time of the falling edge of the signal 1202 is determined based on the time t2 via an offset (calculated, e.g., by a timer), i.e. t2+x. It is another option that the time of the falling edge of the signal 1202 is determined based on the falling edge of the signal 1201, i.e. t1+y. The variables x and y may be in a range from −200 ns to +10 μs, in particular in a range between 0 and 3 μs.

It is an option that the time te is determined based on the time t2 via an offset (calculated, e.g., by a timer), i.e. t2+x. It is another option that the time te is determined based on the falling edge of the signal 1203 or the rising edge of 1204, 1205 or 1206, i.e. t1+y. The variables x and y may be in a range from −200 ns to +10 μs, in particular in a range between 0 and 3 μs.

It is noted that the time te may occur later than or at the time t2. It is an option that the duration te−t2 may be 0, in particular larger than 0, e.g., in a range between 0 and 1 μs, in particular 10 ns, 50 ns, 300 μs or the like. It is further an option that the time te−t2 may be less than 0, e.g., −100 ns.

It is noted that a duration 1207 (ts−t2) can be adjusted as required, e.g., pursuant to efficiency and/or performance conditions. It is further noted that that voltages corresponding to the enhancement state and/or the desaturation state may be freely selectable.

Further, a voltage $V_{ce}$ across the collector and the emitter is shown as a signal 1203 for the RC-IGBT 1101 and as a signal 1204 for the RC-IGBT 1102.

The signal 1204 shows the voltage $V_{ce}$ exemplarily amounting to −1V to −3V between the time t1 and the time ts. After the time ts, the desaturation results in a slight increase of the resistance (resulting in a slight increase of the absolute value of the voltage $V_{ce}$). After the time t2, the voltage $V_{ce}$ of the RC-IGBT 1102 becomes positive (it reaches the level of the intermediate circuit voltage).

Also, a current $I_{ce}$ flowing through the RC-IGBT is depicted as a signal 1205 for the RC-IGBT 1101 and as a signal 1206 for the RC-IGBT 1102. IL indicates the load current flowing through the inductor L.

The RC-IGBTs 1101, 1102 may be controlled via a driver, e.g., a microcontroller. The driver may realize a multi-state control concept for each of the RC-IGBTs 1101, 1102 in order to supply the required voltages to the respective gate dependent on the modes utilized for the RC-IGBTs of the half-bridge arrangement.

As a design option, a number of injected cells used in the desaturation state may be limited via so-called desaturation injection areas. This increases the current density within such areas. In order to avoid strong avalanche generation during the commutation, the gate potential may be set to −15V during the reverse current phase. This avoids an unnecessary increase of the barrier recovery charge and counteracts generation of current filaments. It may be advantageous to set the gate voltage from the desaturation voltage to −15V.

The time tc can be (at the latest) at the time the current 1206
- returns to a reverse blocking current (near zero), e.g., in the range below 1 mA;
- reaches a maximum of the reverse recovery current $I_{RR}$; or
- before the reverse recovery current $I_{RR}$ reaches a certain percentage of the maximum $I_{RR}$ for the first time.

With regard to the reverse recovery current, reference is made to chapter 5.7.2, in particular FIG. 5.23 of [J. Lutz et al., Semiconductor Power Devices, Springer-Verlag Berlin Heidelberg 2011].

It is noted that the time tc can be within a predetermined window around the falling edge of the signal 1201 (in this example shown at the time t1 and t3).

It is in particular an option that the duration during which the signal 1202 is in the enhancement state (in the example shown in FIG. 11 at −15V) amounts to at least 50%, in particular to at least 75% of the time interval between t1 and t2. During the time interval between t1 and t2, the signal 1201 indicates a blocking state of the RC-IGBT 1101 (in the example shown in FIG. 11 the signal 1201 is at −15V between the time t1 and the time t2).

Figure 12:
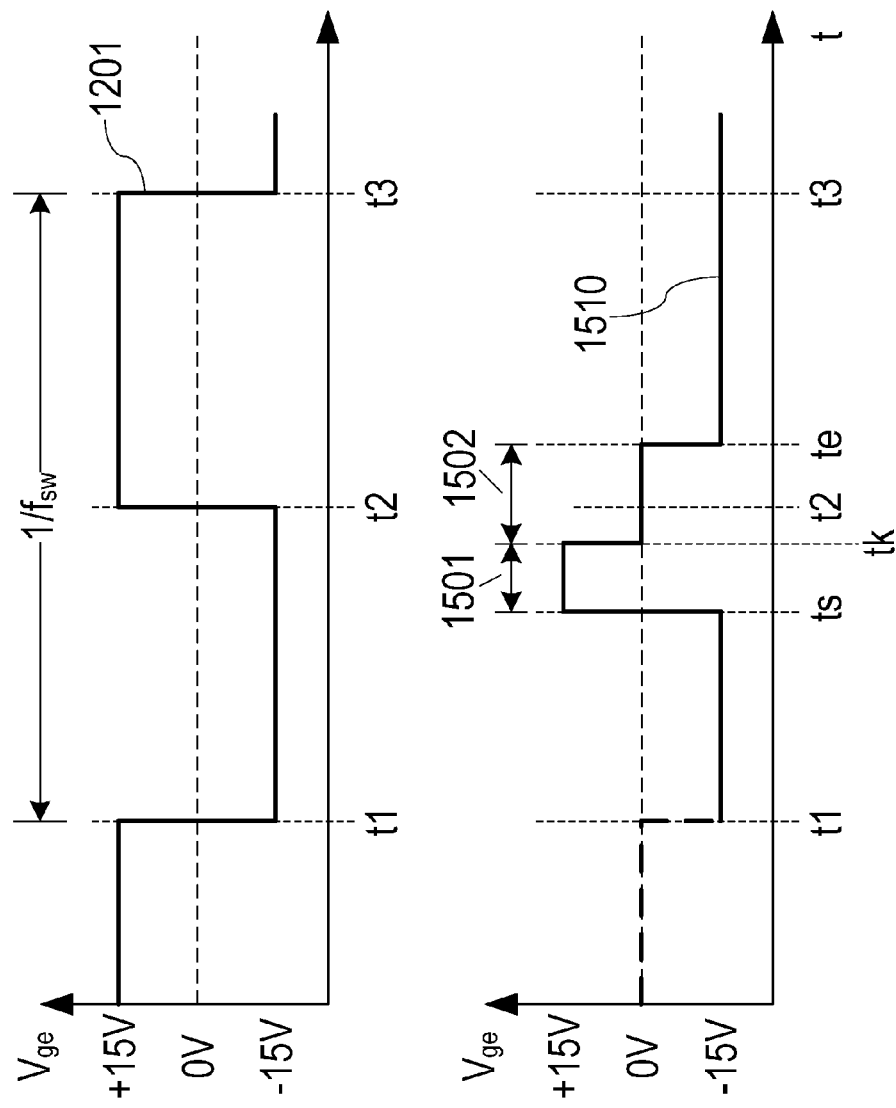
FIG. 12 shows an alternative timing diagram of the RC-IGBTs for a portion of a positive load current $I_L$.

FIG. 12 shows an alternative timing diagram of the RC-IGBTs 1101 and 1102, which are arranged in a half-bridge arrangement according to FIG. 9A for a portion of a positive load current $I_L$. In contrast to the diagram shown in FIG. 11, the desaturation of the RC-IGBTs 1102 is controlled in a different manner.

The signal 1201 corresponds to the signal 1201 shown in FIG. 11 depicting the voltage $V_{ge}$ at the gate of the RC-IGBT 1101, which is in the IGBT-mode.

In contrast to FIG. 11, a signal 1510 shows the voltage $V_{ge}$ at the gate of the RC-IGBT 1102, which is set to +15V at the time ts (instead of 0V as shown for the signal 1202 in FIG. 11). This allows the RC-IGBT 1102 to enter the high desaturation state. The RC-IGBT 1102 enters the low desaturation state at a time tk (applying 0V to its gate), wherein this time tk is prior to the commutation occurring at the time t2. Hence, for a time interval 1501 before the commutation (i.e. before the time t2), the RC-IGBT 1102 is in the high desaturation state and for a time interval 1502, during which the commutation occurs at the time t2, the RC-IGBT 1102 is in the low desaturation state.

The high desaturation state allows extracting the charge faster than in low desaturation state. Hence, an accelerated desaturation is achieved during the time interval 1501.

It is noted that the gate voltages (+15V, 0V, −15V) herein mentioned are exemplary values. As indicated, there may be used, e.g., at least two voltages V1 and V3, wherein V1>0V, V3<0V and V1>V2>V3. It is an option to use more than two voltages above and/or below 0V as threshold voltages applied to the gates to realize different (e.g., desaturation) states. Exemplary values for gate voltages may be +8V and −8V.

It is further noted that instead of absolute threshold values for the gate voltages, value ranges (limited by thresholds) may be used to trigger the respective states for the two modes.

It is also noted that the time diagrams shown and explained herein are simplified for purposes of illustrations. For example, each falling or rising edge may have a slope, i.e. it may take some (short) time to conduct the transition from one value to another. In other words, the transition itself may not be infinitely short.

It is an option that the desaturation state is finished and the enhancement state is entered (the RC-IGBT being in the DIODE-mode) after the commutation, but before a strong or a significant electron avalanche commences.

It is also an option that a conventional IGBT with anti-parallel diodes can be used according to the embodiment visualized in FIG. 9A. The antiparallel diode may in particular be a controllable diode. In such case, the signal 1202 is fed to control the diode or to a controllable diode and the anti-parallel IGBT.

It is a further option that the RC-IGBTs are controlled by a current sensed on a chip, in particular on the RC-IGBT itself. The current sensed may be used to detect the zero-crossing of the current; it may not directly control the RC-IGBT, but may be used as an information for the controlling device, e.g., driver or microcontroller. It is in particular an option that the falling edge of the signal 1205 and/or 1206 is used for triggering the time te, i.e. the time when the RC-IGBT 1102 enters the enhancement state.

It is yet another option that a three-level RC-IGBT is combined with at least one two-level (turn-on or turn-off) RC-IGBT. The level thereby indicates the different voltages applicable to its gate defining a different state as described herein. The two-level RC-IGBT only comprises two (instead) of three such states.

The various voltages applied to the gates of the RC-IGBTs may be generated via passive circuitry comprising, e.g., pull-up and/or pull-down resistors, voltage divider, zener-diodes (e.g., at an output of an integrated circuit providing control signals to the gate). In addition, an analogue control for the voltage (e.g., output at the integrated circuit) may be provided.

It is also an option that voltage levels are provided via a digital interface that may be programmed or programmable. The voltage level provided may be temporarily stored in an integrated register of a driver, wherein such driver may be supplied by an integrated circuit and it may convey its driving signal towards the gate of the RC-IGBT. In addition, an analogue control for the voltage at the output of the driver may be provided.

Also, voltages generated by passive and/or active components and digital interfaces may be combined based on the particular use-case scenario.

The driver may supply a pulse-width-modulated (PWM) signal for driving the RC-IGBT of the half-bridge arrangement. Switching frequencies between up to, e.g., 50 MHz are possible.

Figure 13:
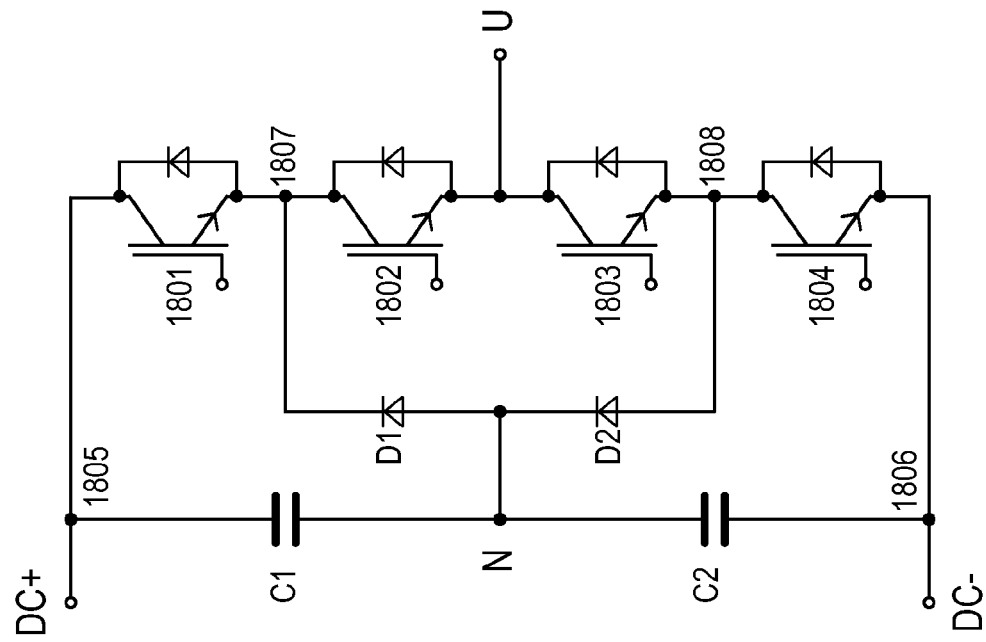
FIG. 13 shows an exemplary topology comprising several half-bridge circuits.

FIG. 13 shows an exemplary topology comprising several half-bridge circuits. A DC voltage is applied between a node 1805 (positive DC voltage) and a node 1806 (negative DC voltage). The node 1805 is connected via a capacitor C1 to a node N and the node N is connected to the node 1806 via a capacitor C2. The node N is connected via a diode D1 to a node 1807, wherein the cathode of the diode D1 is directed towards the node 1807. The node N is connected via a diode D2 to a node 1808, wherein the cathode of the diode D2 is directed towards the node N.

An RC-IGBT 1801 is connected between the node 1805 and the node 1807, wherein the collector of the RC-IGBT 1801 is connected to the node 1805 and the emitter of the RC-IGBT 1801 is connected to the node 1807. An RC-IGBT 1802 is connected between the node 1807 and a node U, wherein the collector of the RC-IGBT 1802 is connected to the node 1807 and the emitter of the RC-IGBT 1802 is connected to the node U. An RC-IGBT 1803 is connected between the node U and the node 1808, wherein the collector of the RC-IGBT 1803 is connected to the node U and the emitter of the RC-IGBT 1803 is connected to the node 1808. An RC-IGBT 1804 is connected between the node 1808 and the node 1806, wherein the collector of the RC-IGBT 1804 is connected to the node 1808 and the emitter of the RC-IGBT 1804 is connected to the node 1806.

The RC-IGBTs 1801 to 1804 may be controlled via control unit. An output voltage of the arrangement shown in FIG. 13 is provided at the node U.

FIG. 13 comprises several half-bridge circuits that may be controlled based on the approach described herein. Each of the following combination of RC-IGBTs might be considered as half-bridge circuit (i.e. all combinations comprising two out of the four RC-IGBTs shown in FIG. 13):

RC-IGBT 1801 and RC-IGBT 1802;
RC-IGBT 1801 and RC-IGBT 1803;
RC-IGBT 1801 and RC-IGBT 1804;
RC-IGBT 1802 and RC-IGBT 1803;
RC-IGBT 1802 and RC-IGBT 1804;
RC-IGBT 1803 and RC-IGBT 1804.

Figure 14:
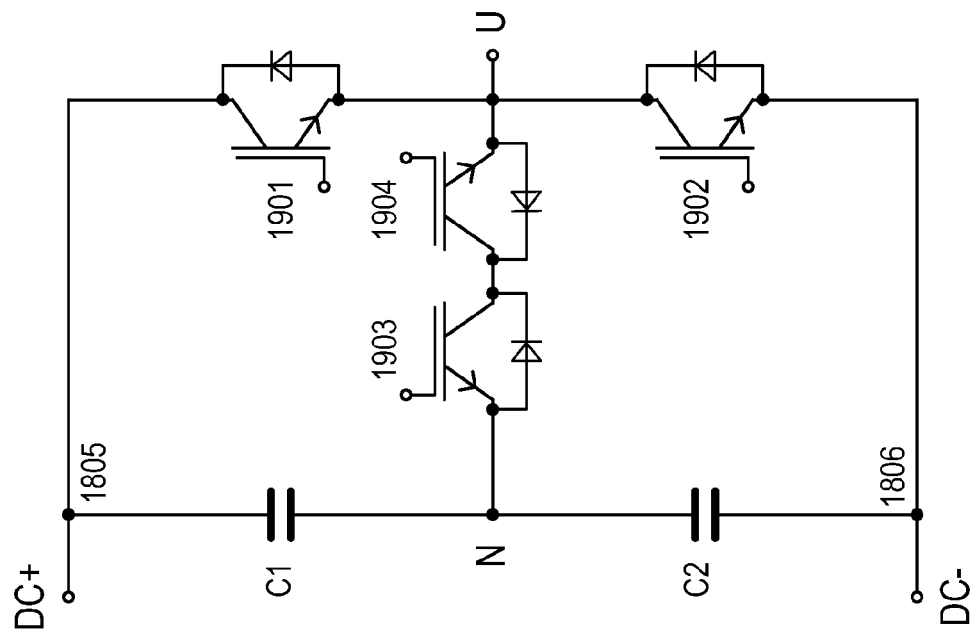
FIG. 14 shows an alternative topology comprising several half-bridge circuits.

FIG. 14 shows an alternative topology comprising several half-bridge circuits. The input stage is similar to the one shown in FIG. 13, i.e. the DC voltage may be applied to the nodes 1805 and 1806 and the capacitors C1, C2 are arranged accordingly.

In contrast to FIG. 13, RC-IGBTs 1901 to 1904 are arranged in a different way: The node N is connected via a series connection comprising the RC-IGBTs 1903 and 1904 to the node U. The emitter of the RC-IGBT 1903 is connected to the node N, the collector of the RC-IGBT 1903 is connected to the collector of the RC-IGBT 1904 and the emitter of the RC-IGBT 1904 is connected to the node U.

The RC-IGBT 1901 is arranged between the node 1805 and the node U, wherein its collector is connected to the node 1805 and its emitter is connected to the node U. The RC-IGBT 1902 is arranged between the node U and the node 1806, wherein its collector is connected to the node U and its emitter is connected to the node 1806.

FIG. 14 comprises several half-bridge circuits that may be controlled based on the approach described herein. Each of the following combination of RC-IGBTs might be considered as half-bridge circuit:

RC-IGBT 1901 and RC-IGBT 1902;
RC-IGBT 1901 and RC-IGBT 1903;
RC-IGBT 1904 and RC-IGBT 1902.

The examples suggested herein may in particular be based on at least one of the following solutions. In particular combinations of the following features could be utilized in order to reach a desired result. The features of the method could be combined with any feature(s) of the device, apparatus or system or vice versa.

A method for controlling a first switch and a second switch is suggested, wherein each switch is an RC-IGBT and wherein both switches are arranged as a half-bridge circuit, the method comprising:
controlling the first switch in an IGBT-mode;
controlling the second switch such that it becomes desaturated when being in a DIODE-mode;
wherein controlling the second switch starts before and lasts at least as long as the first switch changes its IGBT-mode from blocking state to conducting state.

It is noted that the RC-IGBT may be any device comprising at least one component that allows for the functionality as described herein. The RC-IGBT may be realized as a monolithically integrated device. As an option, the RC-IGBT may comprise several discrete elements. The RC-IGBT may in particular comprise a controllable diode that is arranged anti-parallel to a transistor, wherein such transistor may in particular be a MOSFET or an IGBT.

The IGBT-mode may comprise a blocking state and a conducting state; the blocking and conducting state may be controlled by applying a particular voltage to the gate of the IGBT. For example in case the voltage at its gate is 0V or −15V, the switch may reach or be in the blocking state and if +15V are applied to its gate, the switch reaches or is in the conducting state. The IGBT-mode may be reached if the voltage across the collector and emitter of the switch is larger than 0V.

The DIODE-mode may be reached, if the voltage across the collector and emitter of the switch is below 0V. In such scenario, several voltages may be applied to the gate of the switch to differentiate various states of the DIODE-mode: For example, a voltage amounting to −15V results in a strong injection, conducting state;
a voltage of 0V results in a weak injection, conducting state leading to a desaturation; and
a voltage amounting to +15V results in a strong desaturation, conducting state.

Hence, when the first switch in actively switched on and off (in IGBT-mode), the second switch is imprinted its mode(s) dependent on the voltage across the collector and emitter of the second switch. For example, if the first switch is in IGBT-mode, conducting state, the voltage across the collector and emitter of the second switch is larger than 0V thereby imprinting the IGBT-mode on the second switch. In this scenario, as the first switch is the active one, the second switch must not enter the conducting state; hence the gate of the second switch is controlled such that the blocking state is guaranteed.

When the first switch (active one) is switched off, the second switch may enter the DIODE-mode. After that a desaturation may commence. Such desaturation may start before the first switch is switched on again (which is also referred to as commutation) and it may last at least as long as (or longer than) this moment (i.e. when the first switch being switched on again).

The desaturation may start shortly before the commutation, which bears the advantage of low conduction losses. The time difference between the start of the desaturation and the commutation may be in the range between 1 μs and 50 μs, in particular between 2 μs and 10 μs or in particular between 3 μs and 5 μs.

In other words, the second switch is controlled by applying a predefined voltage to its gate that allows (at least partially) desaturating the second switch also at the moment when a rising edge of the control signal (switching the first switch in IGBT-mode, conducting state) is applied to the gate of the first switch.

In an embodiment, the method further comprises:
controlling the second switch such that its desaturation phase ends between a time the current conveyed across the second switch becomes 0 and a time when the current reaches a maximum of a reverse recovery current.

In an embodiment, the end of the desaturation phase is determined by sensing the current in the second switch or in the first switch.

In an embodiment, the step of controlling the gate of the second switch further comprises:
controlling the gate of the second switch with at least one voltage such that it becomes desaturated when being in the DIODE-mode.

In an embodiment, the at least one voltage amounts to 0V or to substantially 0V.

In an embodiment, the at least one voltage comprises a first voltage for a first time period and a second voltage for a second time period.

The second time period may last until or during the rising edge of the first switch changing its IGBT-mode from blocking state to conducting state.

In an embodiment, the first voltage is higher than the second voltage.

As an option, the first voltage may amount to a voltage that enables a high desaturation of the second switch and the second voltage enables a low saturation of the second switch. The second voltage may be applied when the first switch changes from the blocking state to the conducting state (as indicated, the first switch being in the IGBT-mode).

In an embodiment, the method further comprises:
controlling the gate of the second switch with an enhancement voltage that allows the second switch to enter an enhancement state when being in the DIODE-mode, wherein the enhancement voltage is applied prior to the at least one voltage that desaturates the second switch when being in the DIODE-mode.

In an embodiment, each of the first switch and the second switch is a 3-level switch that is arranged to be controlled by at least three different input voltages or three different input voltage ranges applied to its gate.

In an embodiment, the first switch and the second switch are controlled such that at one time only one of them is in the conducting state when in IGBT-mode.

In an embodiment, the first switch and the second switch are each controlled by a driver or by a controller, wherein the voltage applied to the respective gate is generated via a digital or analog interface.

In an embodiment, the first switch and the second switch are controlled in a pulse-width-modulation at a switching frequency that is higher than a frequency of a load current. Said load current may be apparent across an inductor that is connected to a node between the first switch and the second switch of the half-bridge circuit.

In an embodiment, the first switch and the second switch each is a semiconductor device comprising
a barrier region sandwiched between a drift region and a charge carrier transfer region, the barrier and charge carrier transfer regions forming a pn junction and the barrier and drift regions forming a homojunction, wherein an impurity concentration in the barrier region is at least ten times as high as an impurity concentration in the drift region; and a control structure configured to form an inversion layer in the drift and barrier regions in an inversion state and to form no inversion layer in the drift and barrier regions in a non-inversion state.

In an embodiment, the semiconductor device is configured not to form, through the charge carrier transfer region, a path for minority charge carriers in an inversion layer along the control structure between the drift region and a load electrode.

In an embodiment,
the control structure extends from a first surface of a semiconductor body comprising the charge carrier transfer region into the semiconductor body down to at least the drift region, and
the charge carrier transfer region directly adjoins the first surface at the control structure.

In an embodiment,
the control structure extends from a first surface of a semiconductor body comprising the charge carrier transfer region into the semiconductor body down to at least the drift region, and
the control structure comprises a control electrode, a control dielectric sandwiched between the barrier and drift regions on a first side and the control electrode at a second side opposite to the first side, and a top dielectric between the first surface and the control electrode overlaps the charge carrier transfer region in a vertical direction perpendicular to the first surface.

In an embodiment, the semiconductor device is an insulated gate bipolar transistor comprising a field effect transistor cell.

According to an embodiment, the semiconductor device is a reverse conducting insulated gate bipolar transistor comprising a collector layer comprising first zones of a first conductivity type and second zones of a second conductivity type complementary to the first conductivity type between the drift region and a second surface of the semiconductor body opposite to the first surface.

In an embodiment, the transistor cell comprises a body region forming pn junctions with a source region and the drift region, and a gate structure configured to form an inversion layer in the body region during an on state and to form no inversion layer in the body region outside the on state of the transistor cell.

According to an embodiment,
the control structure comprises a control electrode and a control dielectric between the barrier and drift regions on a first side and the control electrode at a second side opposite to the first side,
the gate structure comprises a gate electrode and a gate dielectric between the body region on a first side and the gate electrode at a second side opposite to the first side, and
the gate and control structures are electrically connected to each other.

According to an embodiment,
a voltage higher than a first threshold voltage at the gate and control structures induces the on state,
a voltage lower than a second threshold voltage, which is lower than the first threshold voltage, induces the inversion state, and
a voltage between the first and second threshold induces neither the on state nor the inversion state.

According to an embodiment,
a voltage higher than a first threshold voltage at the gate and control structures induces the on state, a voltage lower than a second threshold voltage, which is higher than the first threshold voltage, induces the inversion state, and a voltage higher than the second threshold voltage induces the non-inversion state.

According to an embodiment, the gate and control dielectrics are provided from different materials and/or the gate and control electrodes are formed from different materials such that a first threshold voltage of the transistor cell is equal to or lower than a second threshold voltage of the auxiliary cell.

According to an embodiment, the control dielectric contains fixed negative charges and/or a work function of a material of the control electrode with respect to the semiconductor body is higher than a work function of a material of the gate electrode.

According to an embodiment, the semiconductor device further comprises a voltage shifter configured to apply a voltage to the control electrodes that deviates from a voltage applied to the gate electrodes by a predefined voltage offset, wherein the voltage offset is greater than a difference between the first and second threshold voltages.

According to an embodiment, the semiconductor device further comprises:
a plurality of auxiliary cells, each auxiliary cell comprising one of the control structures, wherein
a population density of the auxiliary cells in a central region of an active area is higher than in an outer region of the active area oriented to an edge area devoid of auxiliary cells.

According to an embodiment, the barrier region contains impurities of a deep level donor or deep double donor.

Also, the semiconductor device may be an insulated gate bipolar transistor, comprising:
a transistor cell; and
an auxiliary cell comprising a barrier region sandwiched between a drift region and a charge carrier transfer region, the barrier and charge carrier transfer regions forming a pn junction and the barrier and drift regions forming a homojunction, wherein an impurity concentration in the barrier region is at least ten times as high as an impurity concentration in the drift region.

According to an embodiment,
a control structure of the auxiliary cell comprises a control electrode and a control dielectric between the barrier and drift regions on a first side and the control electrode at a second side opposite to the first side, and
the control electrode is electrically connected to a fixed potential with respect to a load electrode.

In an embodiment, the first switch and the second switch each is a semiconductor device comprising
a body zone in a semiconductor mesa formed between neighboring control structures that extend from a first surface into a semiconductor body;
a drift zone forming a first pn junction with the body zone and comprising, in the semiconductor mesa, a first drift zone section that comprises a constricted section of the semiconductor mesa, wherein a minimum horizontal width of the constricted section parallel to the first surface is smaller than a maximum horizontal width of the body zone; and
an emitter layer between the drift zone and a second surface parallel to the first surface, the emitter layer comprising at least one first zone of a conductivity type of the drift zone.

The semiconductor mesa may be any part of an in particular crystalline semiconductor that is adjacent to a drift region and enclosed by two trench structures on both sides. At least one of the trench structures may comprise a gate electrode. The mesa area may be at least 3 times as high as it is broad.

An exemplary semiconductor mesa is described in [Masakiyo Sumitomo, et al.: Low loss IGBT with Partially Narrow Mesa Structure (PNM-IGBT), Proceedings of the 2012 24th International Symposium on Power Semiconductor Devices and ICs, 3-7 Jun. 2012—Bruges, Belgium].

According to an embodiment, the minimum horizontal width of the constricted section is smaller than a horizontal width of the first pn junction.

According to an embodiment, the minimum horizontal width of the constricted section is at most 300 nm.

According to an embodiment, the minimum horizontal width of the constricted section is at most 80% of the maximum horizontal width of the body zone.

According to an embodiment, the at least one first zone of the emitter layer forms a contiguous layer of the first conductivity type.

According to an embodiment, the emitter layer comprises second zones of a conductivity type opposite to the conductivity type of the drift zone between the first zones.

According to an embodiment, at least one of the control structures is configured to induce an inversion layer in the drift zone along the concerned control structure in an enhanced diode mode and no inversion layer in the drift zone in a desaturation mode.

According to an embodiment, the minimum horizontal width of the constricted section varies along a longitudinal extension of the semiconductor mesa by at least 10%.

According to an embodiment, the semiconductor device may comprise a plurality of the semiconductor mesas, wherein the minimum horizontal width of the constricted sections varies among the semiconductor mesas by at least 10%.

According to an embodiment, a vertical extension of the constricted section is at least 0.5 µm.

According to an embodiment, a vertical extension of the constricted section varies by at least 10% along a longitudinal extension of the semiconductor mesa.

According to an embodiment, the semiconductor device may comprise a plurality of the semiconductor mesas, wherein the vertical extension of the constricted sections varies among the semiconductor mesas by at least 10%.

According to an embodiment, the semiconductor device may comprise a transistor cell, wherein in a forward conductive mode charge carriers enter the drift zone through the transistor cell.

According to an embodiment, a population density of the transistor cells varies by more than 10% along a line through a horizontal center of the semiconductor body.

According to an embodiment, the semiconductor device may comprise a contact structure including a first section in an opening of a dielectric capping layer directly adjoining the first surface and a second section sandwiched between the semiconductor mesa and a control electrode included in one of the neighboring control structures.

According to an embodiment,
the control structures comprise a dielectric liner separating control electrodes from the semiconductor body, and
the dielectric liner has a greater width along a bottom portion of the control structure opposite to the emitter layer than in sidewall portions adjoining the semiconductor mesas.

According to an embodiment, the semiconductor device may comprise counter-doped islands embedded in a second drift zone section outside the semiconductor mesa and structurally connected with inversion layers in the drift zone along the control structures in the enhanced diode mode.

Also, an electronic circuit is suggested, said circuit comprising:
a semiconductor device comprising:
a body zone in a semiconductor mesa formed between neighboring control structures that extend from a first surface into a semiconductor body;
a drift zone forming a first pn junction with the body zone and comprising, in the semiconductor mesa, a first drift zone section that comprises a constricted section of the semiconductor mesa, wherein a minimum horizontal width of the constricted section parallel to the first surface is smaller than a maximum horizontal width of the body zone; and
an emitter layer between the drift zone and a second surface parallel to the first surface, the emitter layer comprising at least one first zone of a conductivity type of the drift zone, and
a control circuit having an output electrically coupled to a control electrode formed in the control structures of the semiconductor device, the control circuit configured to output a first control voltage for an enhanced diode mode and a second control voltage for a desaturation mode to the control electrode.

As an option, a semiconductor device may comprise:
a body zone formed in a semiconductor mesa between neighboring control structures that extend from a first surface into a semiconductor body;
a drift zone forming a first pn junction with the body zone and comprising, in the semiconductor mesa, a first drift zone section that comprises a constricted section of the semiconductor mesa, wherein a minimum horizontal width of the constricted section parallel to the first surface is smaller than a maximum horizontal width of the body zone; and
a source zone separated from the drift zone by the body zone and forming a second pn junction with the body zone, wherein the minimum horizontal width is at most equal to a total width of accumulation layers in the constricted section, and the accumulation layers are formed along the control structures in a forward conductive mode during which charge carriers enter the drift zone through the body zone.

According to an embodiment, the accumulation layer is formed along one single of the control structures.

According to an embodiment, two accumulation layers are formed along the two neighboring control structures.

According to an embodiment, at least one of the control structures includes a portion of a first control electrode electrically connected or coupled to a gate terminal and a field electrode dielectrically insulated from the gate electrode.

According to an embodiment, the semiconductor device may comprise a contact structure including a first section in an opening of a dielectric capping layer directly adjoining the first surface and a second section sandwiched between the semiconductor mesa and a field electrode included in one of the neighboring control structures.

Also, a device for operating a first switch and a second switch is suggested, wherein each switch is an RC-IGBT and wherein both switches are arranged as a half-bridge circuit, said device comprising a processing unit which is arranged to controlling the first switch in an IGBT-mode;
controlling the second switch such that it becomes desaturated when being in a DIODE-mode;
wherein controlling the second switch starts before and lasts at least as long as the first switch changes its IGBT-mode from blocking state to conducting state.

Further, a device for controlling a first switch and a second switch is suggested, wherein each switch is an RC-IGBT and wherein both switches are arranged as a half-bridge circuit:
means for controlling the first switch in an IGBT-mode;
means for controlling the second switch such that it becomes desaturated when being in a DIODE-mode;
wherein controlling the second switch starts before and lasts at least as long as the first switch changes its IGBT-mode from blocking state to conducting state.

A computer program product is provided, which directly loadable into a memory of a digital processing device, comprising software code portions for performing the steps of the method as described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A method for controlling a first switch and a second switch, wherein each switch is an RC-IGBT and wherein both switches are arranged as a half-bridge circuit, the method comprising:
   controlling the first switch in an IGBT-mode;
   controlling the second switch such that it becomes desaturated when being in a DIODE-mode;
   wherein controlling the second switch starts before and lasts at least as long as the first switch changes its IGBT-mode from blocking state to conducting state,
   wherein the first switch and the second switch are controlled in a pulse-width-modulation at a switching frequency that is higher than a frequency of a load current.

2. The method according to claim 1, further comprising:
   controlling the second switch such that its desaturation phase ends between a time the current conveyed across the second switch becomes 0 and a time when the current reaches a maximum of a reverse recovery current.

3. The method according to claim 2, wherein the end of the desaturation phase is determined by sensing the current in the second switch or in the first switch.

4. The method according to claim 1, wherein the step of controlling the gate of the second switch further comprises:
   controlling the gate of the second switch with at least one voltage such that it becomes desaturated when being in the DIODE-mode.

5. The method according to claim 4, wherein the at least one voltage amounts to 0V or to substantially 0V.

6. The method according to claim 4, wherein the at least one voltage comprises a first voltage for a first time period and a second voltage for a second time period.

7. The method according to claim 6, wherein the first voltage is higher than the second voltage.

8. The method according to claim 4, further comprising:
   controlling the gate of the second switch with an enhancement voltage that allows the second switch to enter an enhancement state when being in the DIODE-mode,
   wherein the enhancement voltage is applied prior to the at least one voltage that desaturates the second switch when being in the DIODE-mode.

9. The method according to claim 1, wherein each of the first switch and the second switch is a 3-level switch that is arranged to be controlled by at least three different input voltages or three different input voltage ranges applied to its gate.

10. The method according to claim 1, wherein the first switch and the second switch are controlled such that at one time only one of them is in the conducting state when in IGBT-mode.

11. The method according to claim 1, wherein the first switch and the second switch are each controlled by a driver or by a controller, wherein the voltage applied to the respective gate is generated via a digital or analog interface.

12. A computer program product directly loadable into a memory of a digital processing device, comprising software code portions for performing the steps of the method according to claim 1.

13. The method according to claim 1, wherein the first switch and the second switch each is a semiconductor device comprising:
   a barrier region sandwiched between a drift region and a charge carrier transfer region, the barrier and charge carrier transfer regions forming a pn junction and the barrier and drift regions forming a homojunction, wherein an impurity concentration in the barrier region is at least ten times as high as an impurity concentration in the drift region; and
   a control structure configured to form an inversion layer in the drift and barrier regions in an inversion state and to form no inversion layer in the drift and barrier regions in a non-inversion state.

14. The method according to claim 13, wherein the semiconductor device is configured not to form, through the charge carrier transfer region, a path for minority charge carriers in an inversion layer along the control structure between the drift region and a load electrode.

15. The method according to claim 13,
   wherein the control structure extends from a first surface of a semiconductor body comprising the charge carrier transfer region into the semiconductor body down to at least the drift region, and
   wherein the charge carrier transfer region directly adjoins the first surface at the control structure.

16. The method according to claim 13,
wherein the control structure extends from a first surface of a semiconductor body comprising the charge carrier transfer region into the semiconductor body down to at least the drift region, and
wherein the control structure comprises a control electrode, a control dielectric sandwiched between the harrier and drift regions on a first side and the control electrode at a second side opposite to the first side, and a top dielectric between the first surface and the control electrode overlaps the charge carrier transfer region in a vertical direction perpendicular to the first surface.

17. The method according to claim 13, wherein the semiconductor device is an insulated gate bipolar transistor comprising a field effect transistor cell.

18. The method according to claim 17, wherein the transistor cell comprises a body region forming pn junctions with a source region and the drift region, and a gate structure configured to form an inversion layer in the body region during an on state and to form no inversion layer in the body region outside the on state of the transistor cell.

19. The method according to claim 1, wherein the first switch and the second switch each is a semiconductor device comprising:
a body zone in a semiconductor mesa formed between neighboring control structures that extend from a first surface into a semiconductor body;
a drift zone forming a first pn junction with the body zone and comprising, in the semiconductor mesa, a first drift zone section that comprises a constricted section of the semiconductor mesa, wherein a minimum horizontal width of the constricted section parallel to the first surface is smaller than a maximum horizontal width of the body zone; and
an emitter layer between the drift zone and a second surface parallel to the first surface, the emitter layer comprising at least one first zone of a conductivity type of the drift zone.

20. A device for operating a first switch and a second switch, wherein each switch is an RC-IGBT and wherein both switches are arranged as a half-bridge circuit, said device comprising a processing unit configured to:
control the first switch in an IGBT-mode;
control the second switch such that it becomes desaturated when being in a DIODE-mode;
wherein control of the second switch starts before and lasts at least as long as the first switch changes its IGBT-mode from blocking state to conducting state,
wherein the first switch and the second switch are controlled in a pulse-width-modulation at a switching frequency that is higher than a frequency of a load current.

21. A device for controlling a first switch and a second switch, wherein each switch is an RC-IGBT and wherein both switches are arranged as a half-bridge circuit, the device comprising:
means for controlling the first switch in an IGBT-mode;
means for controlling the second switch such that it becomes desaturated when being in a DIODE-mode;
wherein controlling the second switch starts before and lasts at least as long as the first switch changes its IGBT-mode from blocking state to conducting state,
wherein the first switch and the second switch are controlled in a pulse-width-modulation at a switching frequency that is higher than a frequency of a load current.

* * * * *